United States Patent
Lee et al.

(10) Patent No.: US 12,185,464 B2
(45) Date of Patent: Dec. 31, 2024

(54) RIGID FLEXIBLE PRINTED CIRCUIT BOARD AND ELECTRONIC DEVICE COMPRISING SAME

(71) Applicant: Samsung Electronics Co., Ltd., Suwon-si (KR)

(72) Inventors: Youngsun Lee, Suwon-si (KR); Eunseok Hong, Suwon-si (KR); Byeongkeol Kim, Suwon-si (KR); Jongmin Jeon, Suwon-si (KR); Donggon Jang, Suwon-si (KR); Kisoo Jung, Suwon-si (KR); Seounghyun Hong, Suwon-si (KR); Hyunsung Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 210 days.

(21) Appl. No.: 17/587,580

(22) Filed: Jan. 28, 2022

(65) Prior Publication Data

US 2022/0151070 A1    May 12, 2022

Related U.S. Application Data

(63) Continuation of application No. PCT/KR2020/010091, filed on Jul. 30, 2020.

(30) Foreign Application Priority Data

Jul. 30, 2019  (KR) .................. 10-2019-0092500
Jul. 30, 2020  (KR) .................. 10-2020-0094972

(51) Int. Cl.
*H05K 1/02*    (2006.01)
*H01Q 1/24*    (2006.01)
(Continued)

(52) U.S. Cl.
CPC ............. *H05K 1/118* (2013.01); *H01Q 1/243* (2013.01); *H05K 1/0278* (2013.01); *H05K 1/115* (2013.01);
(Continued)

(58) Field of Classification Search
CPC ............ H01Q 1/24; H01Q 1/243; H01Q 1/38; H04M 1/026; H04M 1/0277;
(Continued)

(56) References Cited

U.S. PATENT DOCUMENTS 4,754,319 A    6/1988  Saito et al.
7,082,679 B2   8/2006  Myoung et al.
(Continued)

FOREIGN PATENT DOCUMENTS

JP    2005101430 A  *  4/2005  ............... H05K 1/02
JP    2016-157902 A     9/2016
(Continued)

OTHER PUBLICATIONS

E-761 Epoxy Prepregs_Park Aerospace_pages Jan. 5, 2018.*
(Continued)

*Primary Examiner* — Timothy J Thompson
*Assistant Examiner* — Guillermo J Egoavil
(74) *Attorney, Agent, or Firm* — Jefferson IP Law, LLP

(57) ABSTRACT

An electronic device is provided. The electronic device includes a first electrical element, a second electrical element, and a rigid flexible printed circuit board electrically connecting the first electrical element and the second electrical element, wherein the rigid flexible printed circuit board includes at least one flexible portion including a first dielectric which has a first dielectric constant and is flexible, at least one rigid portion which extends from the flexible portion and includes a second dielectric which has a second dielectric constant and is less flexible than the first dielectric,
(Continued)

a plurality of conductive patterns formed inside the first dielectric and the second dielectric, a plurality of conductive layers formed on the first dielectric and the second dielectric, and a plurality of conductive vias which are formed in the rigid portion and electrically connect the plurality of conductive layers or the plurality of conductive patterns.

20 Claims, 26 Drawing Sheets

(51) Int. Cl.
    *H05K 1/11*           (2006.01)
    *H05K 1/14*           (2006.01)
    *H05K 1/18*           (2006.01)

(52) U.S. Cl.
    CPC ............. *H05K 1/147* (2013.01); *H05K 1/185* (2013.01); *H05K 1/188* (2013.01); *H05K 1/189* (2013.01); *H05K 2201/0141* (2013.01); *H05K 2201/10098* (2013.01)

(58) Field of Classification Search
    CPC .... H05K 1/0218; H05K 1/0278; H05K 1/115; H05K 1/118; H05K 1/147; H05K 1/185; H05K 1/188; H05K 1/189; H05K 1/02; H05K 1/11; H05K 1/14; H05K 1/18; H05K 2201/0141; H05K 2201/09336; H05K 2201/10098
    USPC ........................................................ 361/747
    See application file for complete search history.

(56) References Cited

U.S. PATENT DOCUMENTS

| | | | |
|---|---|---|---|
| 7,730,613 | B2 | 6/2010 | Vasoya |
| 8,198,543 | B2 | 6/2012 | Kang et al. |
| 9,538,646 | B2 * | 1/2017 | Onodera ................ B32B 15/09 |
| 10,727,568 | B2 | 7/2020 | Cho et al. |
| 2009/0028497 | A1 | 1/2009 | Kodama et al. |
| 2011/0203837 | A1 * | 8/2011 | Naganuma ........... H05K 3/4691 |
| | | | 29/829 |
| 2013/0292164 | A1 | 11/2013 | Park et al. |
| 2014/0079403 | A1 * | 3/2014 | Daghighian ............ H01P 3/088 |
| | | | 333/236 |
| 2017/0021412 | A1 | 7/2017 | Ganchrow et al. |
| 2017/0214121 | A1 | 7/2017 | Ganchrow et al. |
| 2018/0063941 | A1 | 3/2018 | Kang |
| 2019/0319341 | A1 * | 10/2019 | Park .................... H01Q 21/065 |
| 2020/0052231 | A1 * | 2/2020 | Nakamura ......... H10K 50/8426 |

FOREIGN PATENT DOCUMENTS

| | | | | |
|---|---|---|---|---|
| JP | 2017-135216 A | | 8/2017 | |
| JP | 2019-47097 A | | 3/2019 | |
| KR | 10-1990-0001745 | | 3/1990 | |
| KR | 10-1131289 B1 | | 3/2012 | |
| KR | 10-2016-0080855 A | | 7/2016 | |
| KR | 20160080855 A | * | 7/2016 | ............... H05K 3/46 |
| KR | 10-2019-0064877 A | | 6/2019 | |

OTHER PUBLICATIONS

Extended European Search Report dated Sep. 5, 2022, issued in European Patent Application No. 20848323.0.
Indian Office Action dated Aug. 21, 2024; Indian Appln. No. 202237010408.

* cited by examiner

RIGID FLEXIBLE PRINTED CIRCUIT BOARD AND ELECTRONIC DEVICE COMPRISING SAME

CROSS-REFERENCE TO RELATED APPLICATION(S)

This application is a continuation application, claiming priority under § 365 (c), of an International application No. PCT/KR2020/010091, filed on Jul. 30, 2020, which was based on and claimed the benefit of a Korean patent application number 10-2019-0092500, filed on Jul. 30, 2019, and of a Korean patent application number 10-2020-0094972, filed on Jul. 30, 2020, in the Korean Intellectual Property Office, the disclosure of each of which is incorporated by reference herein in its entirety.

BACKGROUND

1. Field

The disclosure relates to a rigid flexible printed circuit board and an electronic device including the same.

2. Description of Related Art

With development of digital technology, an electronic device has been provided in different forms such as a smartphone, a tablet personal computer (PC), or a personal digital assistant (PDA). The electronic device has also been developed in a form wearable by a user so that portability and accessibility of the user may be enhanced. With development of wireless communication technology, an electronic device (e.g., a communication electronic device) is commonly used in a daily life, and accordingly, a trend of a content usage is exponentially increasing. The electronic device may include a rigid flexible printed circuit board (RFPCB) for electrically connecting elements (e.g., components or circuits) to each other.

The above information is presented as background information only to assist with an understanding of the disclosure. No determination has been made, and no assertion is made, as to whether any of the above might be applicable as prior art with regard to the disclosure.

SUMMARY

A rigid flexible printed circuit board may include conductive vias. The conductive vias may include a conductive hole made for the purpose of disposing a connection wire for electrically connecting conductive layers arranged in different layers. When at least a part of the rigid flexible printed circuit board is disposed in the electronic device, conductive vias in the bent portion of the rigid flexible printed circuit board may be broken (e.g., a via cracks) due to the bending stresses.

Aspects of the disclosure are to address at least the above-mentioned problems and/or disadvantages and to provide at least the advantages described below. Accordingly, an aspect of the disclosure is to provide a rigid flexible printed circuit board for securing reliability in transferring a signal while preventing a via crack which may be caused by bending when the rigid flexible printed circuit is disposed to be bent, and an electronic device including the same.

Another aspect of the disclosure is to provide a rigid flexible printed circuit board having a reduced thickness by configuring the rigid flexible printed circuit board with one insulation layer, and an electronic device including the same.

Additional aspects will be set forth in part in the description which follows and, in part, will be apparent from the description, or may be learned by practice of the presented embodiments.

In accordance with an aspect of the disclosure, an electronic device is provided. The electronic device includes a first electrical element, a second electrical element, and a rigid flexible printed circuit board configured to electrically connect the first electrical element to the second electrical element, wherein the rigid flexible printed circuit board includes at least one flexible portion including a first dielectric which has a first dielectric constant and is flexible, at least one rigid portion extending from the flexible portion and including a second dielectric which has a second dielectric constant and is less flexible than the first dielectric, multiple conductive patterns formed inside the first dielectric and the second dielectric, multiple conductive layers formed on the first dielectric and the second dielectric, and multiple conductive vias which are formed in the rigid portion and electrically connect the multiple conductive layers to each other or the multiple conductive patterns to each other.

Various embodiments of the disclosure can prevent a via crack which may be caused by bending when a part of a rigid flexible printed circuit board is disposed in a bent form, and also secure reliability in transferring a signal (e.g., can achieve reduction in a signal loss or securing of signal integrity).

Various embodiments of the disclosure can reduce the thickness of a rigid flexible printed circuit board.

In addition, effects obtained or predicted by various embodiments of the disclosure will be directly or suggestively described in the detailed description of embodiments of the disclosure. For example, various effects predicted according to various embodiments of the disclosure will be described in the detailed description below.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

The same reference numerals are used to represent the same elements throughout the drawings.

DETAILED DESCRIPTION

The following description with reference to the attached drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
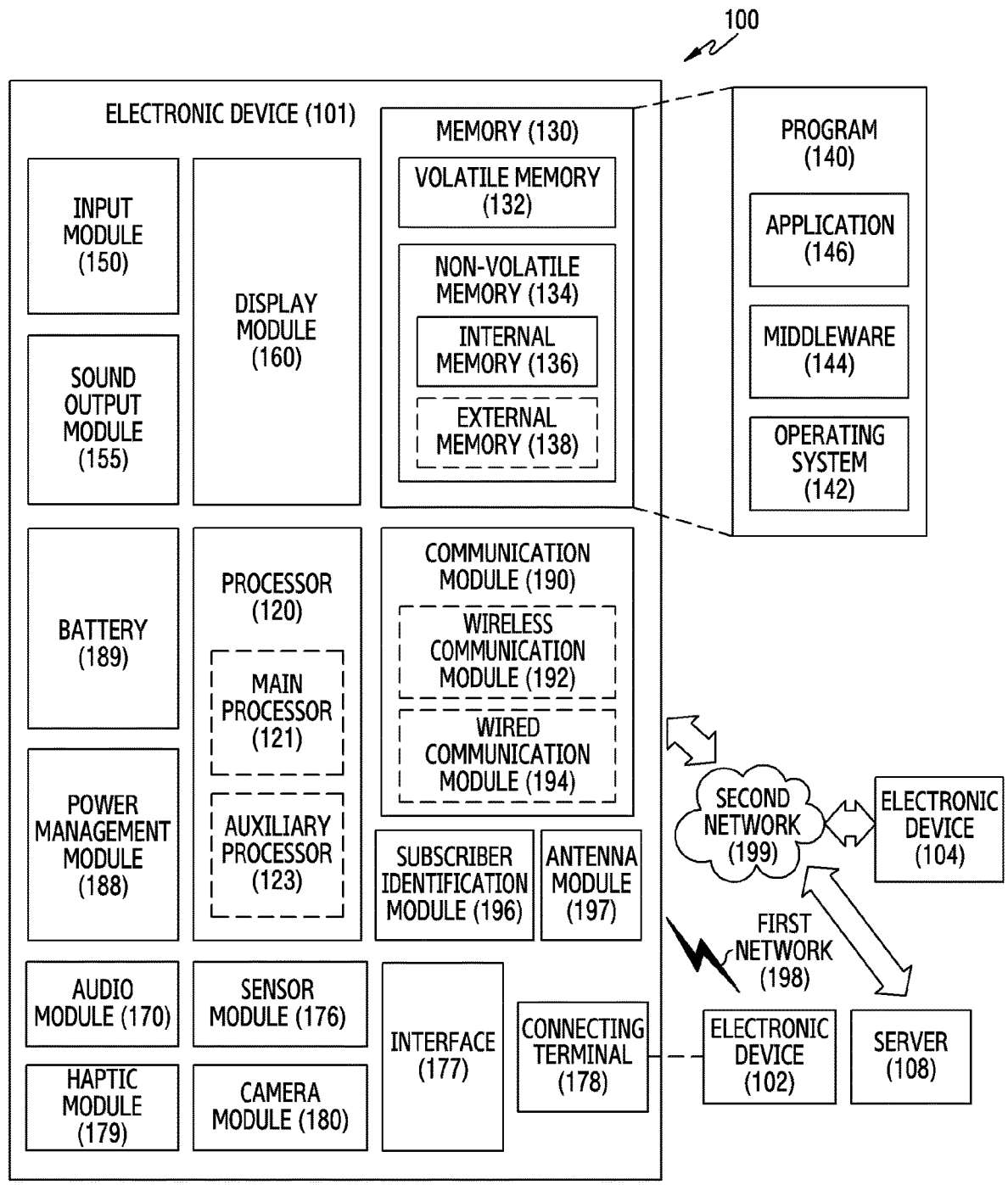
FIG. 1 is a block diagram illustrating an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by another component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector), The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102 or 104, or the server 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
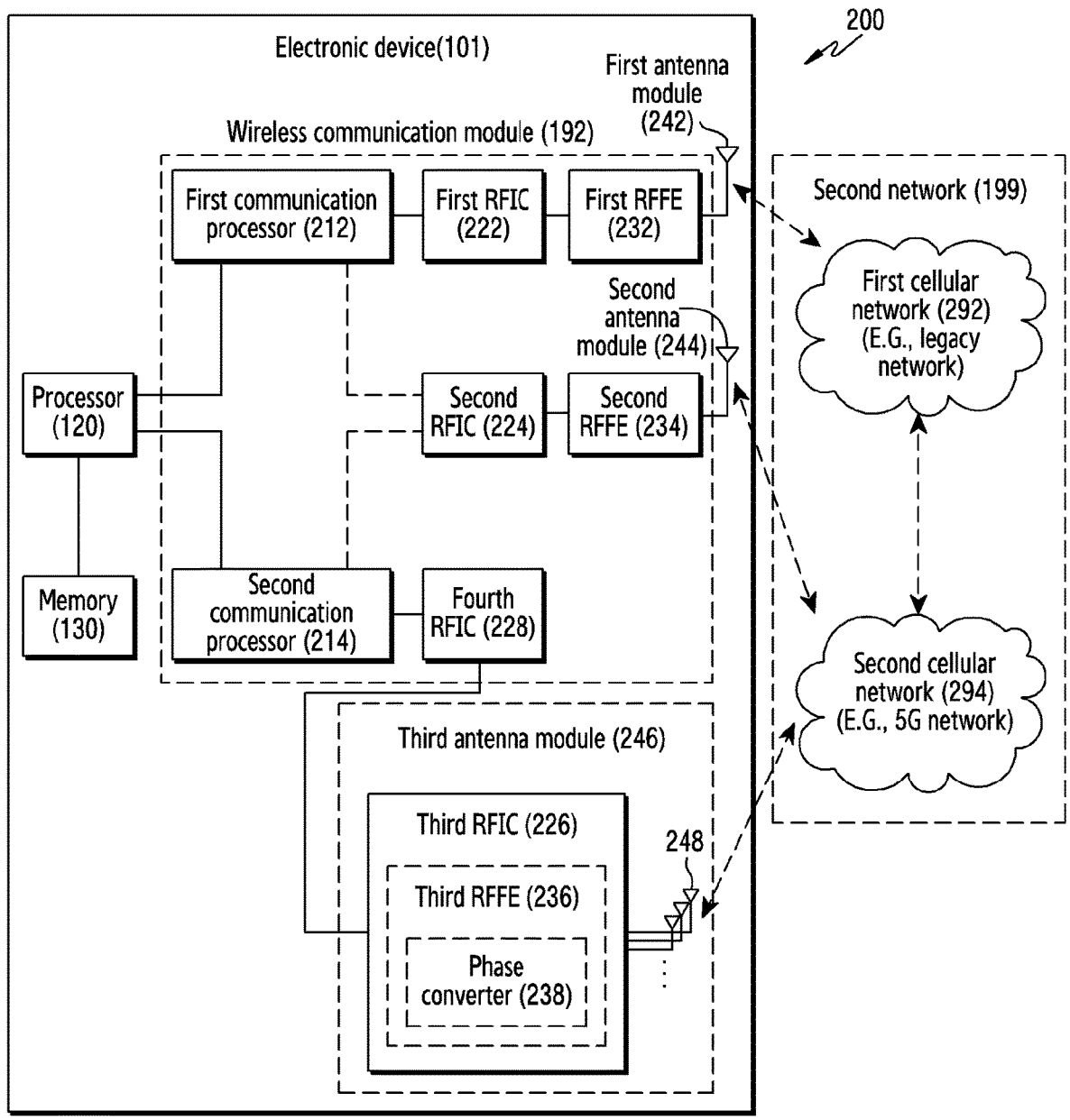
FIG. 2 is a block diagram illustrating an electronic device in a network environment including multiple cellular networks according to an embodiment of the disclosure.

FIG. 2 is a block diagram illustrating an electronic device in a network environment including multiple cellular networks according to an embodiment of the disclosure.

Referring to FIG. 2, in a system 200, the electronic device 101 may include a first communication processor 212, a second communication processor 214, a first radio frequency integrated circuit (RFIC) 222, a second RFIC 224, a third RFIC 226, a fourth RFIC 228, a first radio frequency front end (RFFE) 232, a second RFFE 234, a first antenna module 242, a second antenna module 244, and an antenna 248. The electronic device 101 may further include a processor 120 and a memory 130. The second network 199 may include a first cellular network 292 and a second cellular network 294. According to another embodiment, the electronic device 101 may further include at least one element among elements in FIG. 1, and the second network 199 may further include at least one another network. According to an embodiment, the first communication processor 212, the second communication processor 214, the first RFIC 222, the second RFIC 224, the fourth RFIC 228, the first RFFE 232, and the second RFFE 234 may form at least a part of the wireless communication module 192. According to an embodiment, the fourth RFIC 228 may be omitted, or may be included as a part of the third RFIC 226.

The first communication processor 212 may support establishment of a communication channel of a band to be used for wireless communication with the first cellular network 292, and legacy network communication through the established communication channel. According to various embodiments, the first cellular network may be a legacy network including a $2^{nd}$ generation (2G), $3^{rd}$ generation (3G), $4^{th}$ generation (4G), or long-term evolution (LTE) network. The second communication processor 214 may support establishment of a communication channel corresponding to a designated band (e.g., about 6 GHz to about 60 GHz) among the bands to be used for wireless communication with the second cellular network 294, and $5^{th}$ generation (5G) network communication through the established communication channel. According to various embodiments, the second cellular network 294 may be a 5G network defined in 3GPP. Additionally, according to an embodiment, the first communication processor 212 or the second communication processor 214 may support establishment of a communication channel corresponding to another designated band (e.g., about 6 GHz or less) among the bands to be used for wireless communication with the second cellular network 294, and 5G network communication through the established communication channel. According to an embodiment, the first communication processor 212 and the second communication processor 214 may be implemented in a single chip or a single package. According to various embodiments, the first communication processor 212 or the second communication processor 214 may be formed in a single chip or a single package with a processor 120, an auxiliary processor (e.g., the auxiliary processor 123 of FIG. 1), or a communication module (e.g., the communication module 190 of FIG. 1). According to an embodiment, the first communication processor 212 and the second communication processor 214 may be directly or indirectly connected to each other by an interface (not shown), and may provide or may be provided with data or a control signal in one direction or in opposite directions.

The first RFIC 222, when performing transmission, may convert a baseband signal generated by the first communication processor 212 into a radio frequency (RF) signal of about 700 MHz to about 3 GHz used in the first cellular network 292 (e.g., a legacy network). When performing reception, an RF signal is obtained from the first cellular network 292 (e.g., the legacy network) through an antenna (e.g., the first antenna module 242), and may be pre-processed through an RFFE (e.g., the first RFFE 232). The first RFIC 222 may convert the pre-processed RF signal into a baseband signal so that the signal can be processed by the first communication processor 212.

The second RFIC 224, when performing transmission, may convert the baseband signal generated by the first communication processor 212 or the second communication processor 214 into an RF signal (hereinafter, referred to as a 5G Sub6 RF signal) of a Sub6 band (e.g., about 6 GHz or less) used in the second cellular network 294 (e.g., a 5G network). When performing reception, the 5G Sub6 RF signal is obtained from the second cellular network 294 (e.g., a 5G network) through an antenna (e.g., the second antenna module 244), and may be pre-processed via an RFFE (e.g., the second RFFE 234). The second RFIC 224 may convert the pre-processed 5G Sub6 RF signal into a baseband signal so that the signal can be processed by a corresponding communication processor among the first communication processor 212 or the second communication processor 214.

The third RFIC 226 may convert the baseband signal generated by the second communication processor 214 into an RF signal (hereinafter, referred to as a 5G Above6 RF signal) in the 5G Above6 band (e.g., about 6 GHz to about 60 GHz) to be used in the second cellular network 294 (e.g., a 5G network). When performing reception, the 5G Above6 RF signal may be obtained from the second cellular network 294 (e.g., the 5G network) through an antenna (e.g., the antenna 248) and may be pre-processed through the third RFFE 236. The third RFIC 226 may convert the pre-processed 5G Above6 RF signal into a baseband signal so that the signal can be processed by the second communication processor 214. According to an embodiment, the third RFFE 236 may be formed as a part of the third RFIC 226.

The electronic device 101 may include the fourth RFIC 228 separately from or at least as a part of the third RFIC 226 according to an embodiment. In this case, the fourth RFIC 228 may convert the baseband signal generated by the second communication processor 214 into an RF signal (hereinafter, referred to as an intermediate frequency (IF) signal) of an IF band (e.g., about 9 GHz to about 11 GHz), and then may transfer the IF signal to the third RFIC 226. The third RFIC 226 may convert the IF signal into a 5G Above6 RF signal. When performing reception, the 5G Above6 RF signal may be received from the second cellular network 294 (e.g., the 5G network) through an antenna (e.g., the antenna 248) and converted into an IF signal by the third RFIC 226. The fourth RFIC 228 may convert the IF signal into a baseband signal so that the signal can be processed by the second communication processor 214.

According to an embodiment, the first RFIC 222 and the second RFIC 224 may be implemented as at least a part of a single chip or a single package. According an embodiment, the first RFFE 232 and the second RFFE 234 may be implemented as at least a part of a single chip or a single package. According to an embodiment, at least one antenna module of the first antenna module 242 and the second antenna module 244 may be omitted or combined with another antenna module to process RF signals of multiple corresponding bands.

According to an embodiment, the third RFIC 226 and the antenna 248 may be arranged on the same substrate to form the third antenna module 246. For example, the wireless communication module 192 or the processor 120 may be disposed on a first substrate (e.g., main PCB). In this case, the third RFIC 226 may be disposed in a partial area (e.g., the lower surface) of a second substrate (e.g., a sub PCB) separated from the first substrate, and the antenna 248 may be disposed in another partial area (e.g., upper surface), so that the third antenna module 246 is formed. By arranging the third RFIC 226 and the antenna 248 in the same substrate, it is possible to reduce the length of the transmission line therebetween. For example, this may reduce loss or attenuation of a signal due to a transmission line in a high frequency band (e.g., about 6 GHz to about 60 GHz) used for 5G network communication. Accordingly, the electronic device 101 can improve the quality or speed of communication with the second cellular network 294 (e.g., the 5G network).

According to an embodiment, the antenna 248 may include an antenna array including multiple antenna elements that may be used for beamforming. In this case, the third RFIC 226 may include multiple phase shifters 238 corresponding to multiple antenna elements, for example, as a part of the third RFFE 236. When performing transmission, each of the multiple phase shifters 238 may shift the phase of the 5G Above6 RF signal to be transmitted to the outside (e.g., a base station of a 5G network) of the electronic device 101 through a corresponding antenna element. When performing reception, each of the multiple phase shifters 238 may shift the phase of the 5G Above6 RF signal received from the outside to the same or substantially the same phase through a corresponding antenna element. This enables transmission or reception through beamforming between the electronic device 101 and the outside.

The second cellular network 294 (e.g., the 5G network) may be operated independently from the first cellular network 292 (e.g., the legacy network) (e.g., stand-alone (SA)), or may be connected and operated (e.g., non-stand-alone (NSA)). For example, the 5G network may have only an access network (e.g., 5G radio access network (RAN) or next generation RAN (NG RAN)), and have no core network (e.g., next generation core (NGC)). In this case, the electronic device 101 may access the access network of the 5G network, and then access an external network (e.g., the Internet) under the control of the core network (e.g., evolved packed core (EPC)) of the legacy network. Protocol information (e.g., LTE protocol information) for communication with a legacy network or protocol information (e.g., new radio (NR) protocol information) for communication with a 5G network may be stored in the memory 130, and may be accessed by other elements (e.g., the processor 120, the first communication processor 212, or the second communication processor 214).

Figure 3:
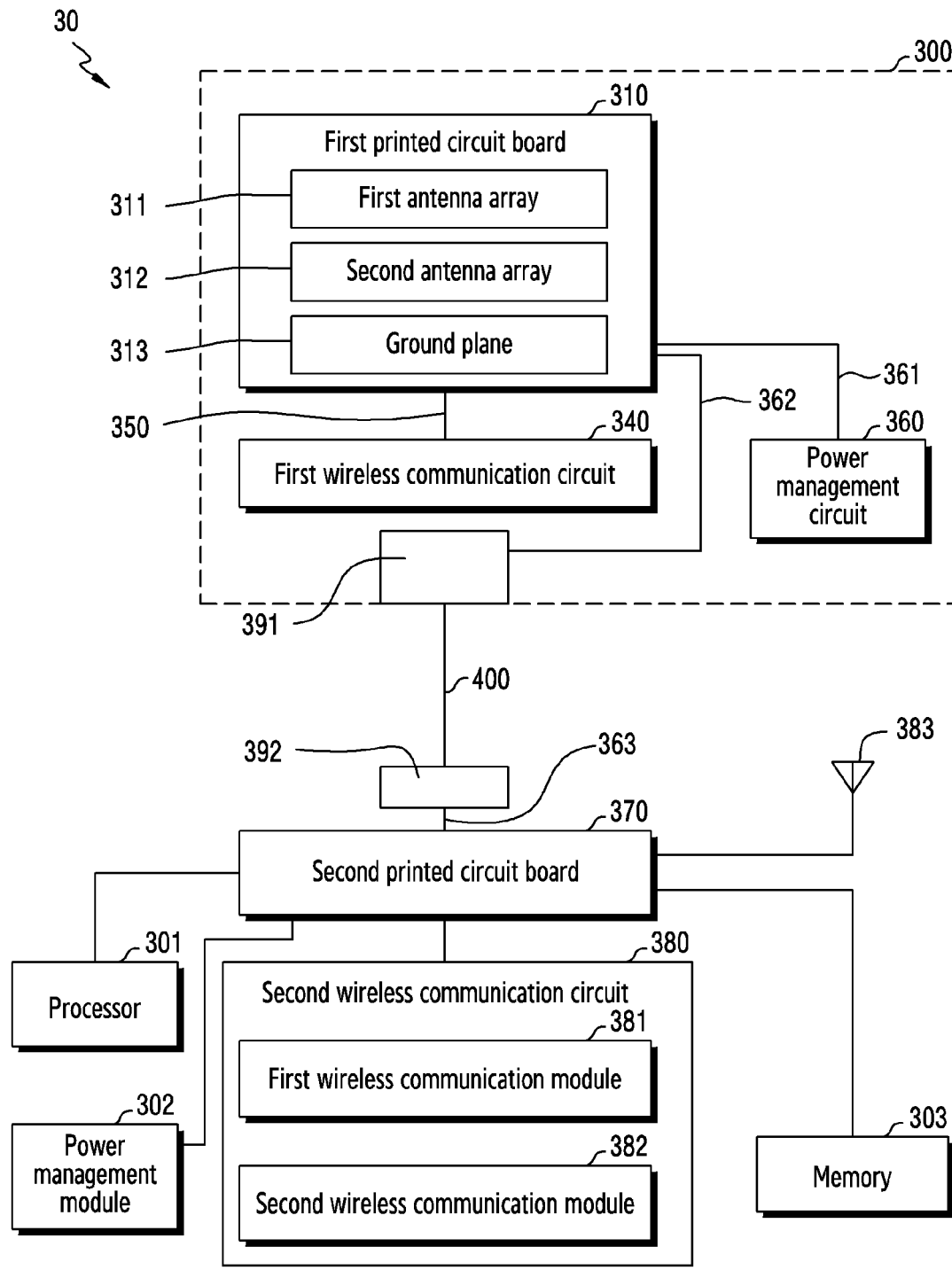
FIG. 3 is a block diagram illustrating an electronic device including an antenna module according to an embodiment of the disclosure.

FIG. 3 is a block diagram illustrating an electronic device including an antenna module according to an embodiment of the disclosure.

Referring to FIG. 3, in an embodiment, an electronic device 30 (e.g., the electronic device 101 of FIG. 1 or 2) may include at least one antenna module 300 (e.g., the antenna module 197 of FIG. 1, or the second antenna module 244 or the third antenna module 246 of FIG. 2), a processor 301 (e.g., the processor 120 of FIG. 1 or 2), a power management module 302 (e.g., the power management module 188 of FIG. 1), a memory 303 (e.g., the memory 130 of FIG. 1 or 2), a second printed circuit board 370, a second wireless communication circuit 380 (e.g., the wireless communication module 192 of FIG. 1 or 2), or at least one antenna 383 (e.g., the antenna module 197 of FIG. 1, the first antenna module 242 of FIG. 2, or the at least one antenna 383 of FIG. 3).

According to an embodiment, the antenna module 300 may include at least one of a first printed circuit board 310, a first wireless communication circuit 340, a power management circuit 360, or a first connector 391.

According to an embodiment, the first printed circuit board 310 may include at least one antenna 311 or 312. For example, the at least one antenna 311 or 312 may include at least a part of multiple conductive layers (e.g., multiple conductive pattern layers or multiple circuit layers) included in the first printed circuit board 310.

According to an embodiment, the at least one antenna 311 or 312 may include at least one of the first antenna array 311 or the second antenna array 312. The first antenna array 311 or the second antenna array 312 may include a structure in which multiple antenna elements having substantially the same shape are arranged or a structure in which multiple antenna elements are arranged at regular intervals.

According to an embodiment, the multiple antenna elements included in the first antenna array 311 or the second antenna array 312 may include, for example, patch antennas, loop antennas, or dipole antennas.

According to an embodiment, the multiple antenna elements included in the first antenna array 311 and/or the second antenna array 312 may be electrically connected to the first wireless communication circuit 340. Some of the multiple antenna elements included in the first antenna array 311 and/or the second antenna array 312 may be utilized as a dummy element (e.g., a dummy antenna). The dummy element may be physically separated from other conductive elements and may be in electrically floating state. The dummy element may be electromagnetically coupled to an antenna element electrically connected to the first wireless communication circuit 340, so as to adjust radiation characteristics. For example, the dummy element may move a resonance frequency to a designated frequency, or move the resonance frequency by a designated level. For example, the dummy element can reduce electromagnetic noise, thereby improving the performance of the antenna.

According to an embodiment, at least some of the multiple conductive layers (e.g., the multiple conductive pattern layers or the multiple circuit layers) included in the first printed circuit board 310 may include a ground plane (or a ground layer) 313. The ground plane 313 may shield or reduce electromagnetic noise for a flow of a signal or power in the first printed circuit board 310.

According to an embodiment, the ground plane 313 may be related to the radiation characteristics of the antenna module 300. The first printed circuit board 310 may include multiple conductive layers and an insulation material disposed between the multiple conductive layers. The multiple antenna elements of the first antenna array 311 and/or the second antenna array 312 may include at least some of the multiple conductive layers. The ground plane 313 may include at least some of the multiple conductive layers. According to an embodiment, the multiple antenna elements may be arranged in different layers. According to an embodiment, the at least one antenna element and the ground plane 313 may be arranged in different layers. The radiation characteristics of the antenna module 300 may vary according electrical parameters such as resistance, inductance, and capacitance provided to a transmission line between the at least one antenna 311 or 312 and the first wireless communication circuit 340. For example, the radiation characteristics of the antenna module 300 may be determined based on a shape (e.g., the width, the length, or the thickness) of each of the multiple antennas included in the first antenna array 311 or the second antenna array 312. For example, the radiation characteristics of the antenna module 300 may be determined based on the distance by which the multiple antenna elements included in the first antenna array 311 or the second antenna array 312 are spaced apart from the ground plane 313. For example, the radiation characteristics of the antenna module 300 may be determined based on a shape (e.g., the width, the length, or the thickness) of the ground plane 313. For example, the radiation characteristics of the antenna module 300 may be determined based on an insulation material (e.g., a dielectric constant) between the ground plane 313 and the multiple antenna elements included in the first antenna array 311 or the second antenna array 312.

According to an embodiment, the first wireless communication circuit 340 may be disposed on or coupled to the first printed circuit board 310, and may be electrically connected to the first printed circuit board 310. The first printed circuit board 310 may include a first surface and a second surface which are oriented in opposite directions to each other. According to an embodiment, the first wireless communication circuit 340 may be disposed on the first surface or the second surface of the first printed circuit board 310 through a conductive bonding member 350 such as solder, and may be electrically connected to the first printed circuit board 310. The first wireless communication circuit 340 may be electrically connected to the first antenna array 311 and the second antenna array 312 through lines included in the first printed circuit board 310. For example, the first wireless communication circuit 340 may include a circuit element (e.g., an RFIC) which can be mounted on the first printed circuit board 310 by using the conductive bonding member 350 such as solder.

According to an embodiment, the first wireless communication circuit 340 may transmit and/or receive a second signal in at least some frequency bands (e.g., a frequency band from about 24 GHz to about 100 GHz, a frequency band from about 24 GHz to about 30 GHz, or a frequency band from about 37 GHz to about 40 GHz) from about 6 GHz to about 100 GHz through the first antenna array 311 and/or the second antenna array 312. According to an embodiment, the first wireless communication circuit 340 may up-convert or down-covert a frequency of a signal transmitted or received in wireless communication. For example, the first wireless communication circuit 340 may receive an IF signal from the second wireless communication module 382 disposed on the second printed circuit board 370, and up-convert the received IF signal into a radio frequency (RF) signal. For example, the first wireless communication circuit 340 may down-convert an RF signal (e.g., a millimeter wave) received through the first antenna array 311 or the second antenna array 312 into an IF signal, and may provide the IF signal to the second wireless communication module 382 disposed on the second printed circuit board 370.

According to an embodiment, at least some of the multiple conductive layers included in the first printed circuit board 310 may include a transmission line (e.g., an RF line) between the first wireless communication circuit 340 and the at least one antenna 311 or 312. The transmission line has a structure for transferring a frequency signal (e.g., a voltage or a current), and may be referred to as a conductor system using a propagation operation of a wave by an electrical parameter (e.g., resistance, inductance, conductance, or capacitance per unit length). For example, at least some of the multiple conductive layers included in the first printed circuit board 310 may include an electrical path (or line) for supplying power to the at least one antenna 311 or 312 between the first wireless communication circuit 340 and the at least one antenna 311 or 312.

According to an embodiment, the first connector 391 may be disposed on or coupled to a second surface (e.g., a surface on which the first wireless communication circuit 340 is disposed) of the first printed circuit board 310 through the conductive bonding member 362 such as solder, and may be electrically connected to the first printed circuit board 310. At least some of the multiple conductive layers included in the first printed circuit board 310 may include an electrical path for electrically connecting the first connector 391 and the first wireless communication circuit 340.

According to an embodiment, the second connector 392 may be disposed on or coupled to the second printed circuit board 370 through the conductive bonding member 363 such as solder, and may be electrically connected to the second printed circuit board 370. According to an embodiment, the electronic device 30 may include a rigid flexible printed circuit board (RFPCB) 400 of FIG. 4 for electrically connecting the first connector 391 and the second connector 392. The rigid flexible printed circuit board 400 may electrically connect the antenna module 300 and the second printed circuit board 370.

According to an embodiment, the processor 301, the second wireless communication circuit 380, the power management module 302, the memory 303, or the at least one antenna 383 may be electrically connected to the second printed circuit board 370. The processor 301, the second wireless communication circuit 380, the power management module 302, or the memory 303 may be disposed on or coupled to the second printed circuit board 370 through a conductive bonding member (e.g., the conductive bonding member 350) such as solder. According to an embodiment, the at least one antenna 383 may be separated from the second printed circuit board 370, and may be electrically connected to the second printed circuit board 370 through a conductive member. In some embodiments, the at least one antenna 383 may be disposed on the second printed circuit board 370, or may be implemented as a conductive pattern included in the second printed circuit board 370. According to various embodiments, the at least one antenna 383 may be disposed in a housing (not shown) forming the exterior of the electronic device 30, or may include at least a part of the housing (e.g., at least a part of a member forming a side surface).

According to an embodiment, the processor 301 may execute software to control at least one element (e.g., a hardware or software element) of the electronic device 30 electrically connected to the processor 301, and may perform various data processing or computation. According to an embodiment, the processor 301 may process a command or data stored in the memory 303. For example, the processor 301 may transmit and/or receive a signal through the second wireless communication circuit 380. The processor 301 may write and read data in and from the memory 303. The processor 301 may perform protocol stack functions required in a communication standard. A part of the second wireless communication circuit 380 and/or the processor 301 may be called a communication processor (CP).

According to an embodiment, the second wireless communication circuit 380 may perform functions for transmitting or receiving a signal through a wireless channel. For example, the second wireless communication circuit 380 may perform a conversion function between a baseband signal and/or a bit string according to a physical layer standard of a system. For example, when transmitting data, the second wireless communication circuit 380 may generate complex symbols by encoding and modulating a transmitted bit string. When receiving data, the second wireless communication circuit 380 may restore the received bit string by demodulating and decoding the baseband signal. The second wireless communication circuit 380 may up-convert an RF signal and then transmit the RF signal through an at least one antenna, and may down-convert an RF signal received through the at least one antenna into a baseband signal. For example, the second wireless communication circuit 380 may include elements such as a transmission filter, a reception filter, an amplifier, a mixer, an oscillator, a digital to analog converter (DAC), or an analog to digital converter (ADC).

According to various embodiments, the second wireless communication circuit 380 may include multiple wireless communication modules to process signals in different frequency bands. For example, the second wireless communication circuit 380 may include multiple wireless communication modules to support multiple different wireless access technologies. For example, the different wireless access technologies may include Bluetooth low energy (BLE), wireless fidelity (Wi-Fi), Wi-Fi gigabyte (WiGig), or a cellular network (e.g., long term evolution (LTE)). In addition, the different frequency bands may include a super high frequency (SHF) (e.g., about 2.5 GHz or about 5 GHz) band, a millimeter wave (e.g., about 60 GHz) band.

According to an embodiment, the second wireless communication circuit 380 may be electrically connected to the antenna module 300 through the rigid flexible printed circuit board 400. For example, the second wireless communication circuit 380 may include a baseband processor or at least one communication circuit (e.g., an intermediate frequency integrated circuit (IFIC) or a radio frequency integrated circuit (RFIC)). The second wireless communication circuit 380 may include, for example, a baseband processor separately from the processor 301 (e.g., an application processor (AP)).

According to an embodiment, the second wireless communication circuit 380 may include at least one of the first wireless communication module 381 or the second wireless communication module 382. The electronic device 30 may further include one or more interfaces for supporting inter-chip communication between the second wireless communication circuit 380 and the processor 301. The processor 301 and the first wireless communication module 381 or the second wireless communication module 382 may transmit and receive data (or a signal) by using the inter-chip interface (e.g., an inter processor communication channel).

According to an embodiment, the first wireless communication module 381 or the second wireless communication module 382 may provide an interface for performing communication with other objects. The first wireless communication module 381 may support, for example, wireless communication relating to a first network (e.g., the first cellular network 292 of FIG. 2) which utilizes the at least one antenna 383. The second wireless communication module 382 may support, for example, wireless communication relating to a second network (e.g., the second cellular network 294 of FIG. 2) which utilizes the at least one antenna module 300. According to an embodiment, the first network may include a $4^{th}$ generation (4G) network, and the second network may include a $5^{th}$ generation (5G) network. The 4G network may support, for example, a long-term evolution (LTE) protocol specified in 3GPP. The 5G network may support, for example, a new radio (NR) protocol specified in 3GPP. According to various embodiments, the first network may be related to wireless fidelity (Wi-Fi) or a global positioning system (GPS).

According to an embodiment, the first wireless communication module 381 may receive a high-frequency signal (hereinafter, referred to as a radio frequency (RF) signal) relating to the first network (e.g., the 4G network) through the at least one antenna 383, and modulate (e.g., down-convert) the received RF signal the same into a low-frequency signal (hereinafter, a baseband signal) to transmit the same to the processor 301. The first wireless communication module 381 may receive a baseband signal relating to the first network from the processor 301, and modulate (e.g., up-convert) the received baseband signal into an RF signal to transmit the same to the outside through the at least one antenna 383. According to an embodiment, the first wireless communication module 381 may include an RFIC. According to various embodiments, when the RF signal is modulated into the baseband signal, or the baseband signal is modulated into the RF signal, an input of a local oscillator (LO) may be utilized.

According to an embodiment, the second wireless communication module 382 may receive a baseband signal relating to the second network from the processor 301. The second wireless communication module 382 may up-convert a baseband signal into an IF signal by utilizing an input (e.g., an LO signal) of a local oscillator (LO), and may transmit the IF signal to the antenna module 300 through the rigid flexible printed circuit board 400. The antenna module 300 may receive the IF signal from the second wireless communication module 382 through the rigid flexible printed circuit board 400. The antenna module 300 may up-convert the IF signal into the RF signal by utilizing the LO signal, and transmit the RF signal to the outside through the at least one antenna 311 or 312 included in the antenna module 300.

According to an embodiment, the antenna module 300 may receive the RF signal through the at least one antenna 311 or 312. The antenna module 300 may down-convert the RF signal into the IF signal by utilizing the LO signal, and may transmit the IF signal to the second wireless communication module 382 through the rigid flexible printed circuit board 400. The second wireless communication module 382 may receive the IF signal from the antenna module 300 through the rigid flexible printed circuit board 400. The second wireless communication module 382 may downconvert the IF signal into the baseband signal by utilizing the LO signal, and may transmit the baseband signal to the processor 301. According to an embodiment, the second wireless communication module 382 may include an IFIC. The second wireless communication module 382 may transmit and/or receive a first signal in a frequency band between about 5 GHz and about 15 GHz. According to an embodiment, the antenna module 300 may include an RFIC.

According to an embodiment, the second wireless communication module 382 or the first wireless communication circuit 340 may include multiple transmission/reception paths. For example, the second wireless communication module 382 or the first wireless communication circuit 340 may include a beamforming system for processing a transmission or reception signal so that energy radiated from antenna elements of the first antenna array 311 or the second antenna array 312 is concentrated in a space in a specific direction. The beamforming system may cause a signal having a stronger strength to be received in a desired direction, a signal to be transferred in a desired direction, or a signal coming from an undesired direction not to be received. The beamforming system may adjust the shape and the direction of a beam by using an amplitude or phase difference between carrier signals in an RF band. According to an embodiment, the second wireless communication module 382 or the first wireless communication circuit 340 may perform control to have a phase difference for each antenna element. For example, the second wireless communication module 382 or the first wireless communication circuit 340 may include a first electrical path electrically connected to a first point on a first antenna element, and a second electrical path electrically connected to a second point on a second antenna element. The processor 301, the second wireless communication module 382, or the first wireless communication circuit 340 may provide a phase difference between a first signal at the first point and a second signal at the second point. According to various embodiments, the electronic device 30 may include one or more phase shifters arranged on the first printed circuit board 310 or the second printed circuit board 370. The one or more phase shifters may adjust the phases of multiple antenna elements of the first antenna array 311 or the second antenna array 312.

According to an embodiment, the memory 303 may store codebook information relating to beamforming. The processor 301, the second wireless communication module 382, or the first wireless communication circuit 340 may efficiently control (e.g., allocate or arrange) multiple beams through the multiple antenna elements of the first antenna array 311 or the second antenna array 312 on the basis of the codebook information.

According to various embodiments, the first wireless communication module 381 and/or the second wireless communication module 382 may form one module with the processor 301. For example, the first wireless communication module 381 and/or the second wireless communication module 382 may be integrally formed with the processor 301. In some embodiments, the first wireless communication module 381 and/or the second wireless communication module 382 may be formed in a single chip or in the form of an independent chip.

According to an embodiment, the processor 301 and one wireless communication module (e.g., the first wireless communication module 381) may be integrally formed in a single chip (an SoC chip), and the other wireless communication module (e.g., the second wireless communication module 382) may be formed in the form of an independent chip.

According to an embodiment, at least some of multiple layers included in the first printed circuit board 310 may include an electrical path utilized in exchanging a signal related to various logics (e.g., logic related to the second cellular network 294 of FIG. 2) between the first wireless communication circuit 340 and the second wireless communication module 382.

According to an embodiment, the power management module 302 (e.g., the power management module 188 of FIG. 1) may manage power supplied to the electronic device 30 by using power of a battery (e.g., the battery 189 of FIG. 1) electrically connected to the second printed circuit board 370.

According to an embodiment, the power management circuit 360 may be disposed on or coupled to a second surface (e.g., a surface on which the first wireless communication circuit 340 is disposed) of the first printed circuit board 310 through a conductive bonding member 361 such as solder, and may be electrically connected to the first printed circuit board 310. The power management circuit 360 may receive power from the power management module 302 through the rigid flexible printed circuit board 400, and manage power supplied to the antenna module 300 by using the received power. According to an embodiment, the power management circuit 360 may be implemented as, for example, at least a part of a power management integrated circuit (PMIC).

In some embodiments, the power management circuit 360 may be omitted from the antenna module 300. For example, the power management module 302 may manage power supplied to the antenna module 300.

According to an embodiment, at least some of the multiple layers included in the first printed circuit board 310 may include an electrical path for connecting the first connector 391 and the power management circuit 360.

According to an embodiment, at least some of the multiple layers included in the first printed circuit board 310 may include a conductive path for providing power to load elements (e.g., the first wireless communication circuit 340) between the power management circuit 360 and the load elements.

According to various embodiments (not shown), the electronic device 30 may further include a frequency adjustment circuit disposed on the first printed circuit board 310. The radiation characteristics and the impedance of at least one antenna 311 or 312 may be related to the performance of the antenna, and may vary according to the shape, the size, and the material of the antenna element. The radiation characteristics of the antenna element may include an antenna radiation pattern (or an antenna pattern) corresponding to a directional function indicating a relative distribution of power radiated from the antenna element, and a polarization state (or antenna polarization) of an electric wave radiated from the antenna element. The impedance of the antenna element may be related to transferring of power from a transmitter to the antenna element or transferring of power from the antenna element to a receiver. In order to minimize reflection in a connecting part between the transmission line and the antenna element, the impedance of the antenna element may be designed to match to the impedance of the transmission line, and accordingly, transferring maximum power (or minimizing a power loss) or efficiently transferring a signal through the antenna element may be possible. The impedance matching may lead to an efficient signal flow in a specific frequency (e.g., a resonance frequency). The impedance mismatching may cause a power loss or reduction in a transmission or reception signal, thereby degrading a communication performance. According to an embodiment, the frequency adjustment circuit (e.g., a passive element) disposed on the first printed circuit board 310 may solve a problem of such impedance mismatching. According to an embodiment, the frequency adjustment circuit may move a resonance frequency to a designated frequency, or move the resonance frequency by a designated level.

According to an embodiment, at least some of the multiple layers included in the first printed circuit board 310 may include an electrical path for electrically connecting the frequency adjustment circuit (e.g., the passive element) to the first wireless communication circuit 340 or the at least one antenna 311 or 312.

Figure 4:
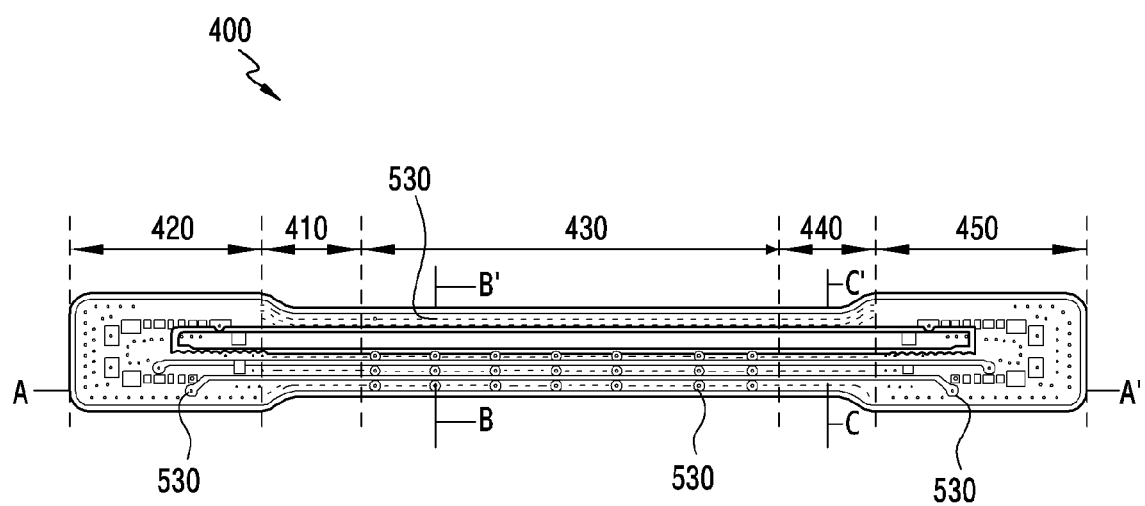
FIG. 4 is a plane view illustrating a rigid flexible printed circuit board according to an embodiment of the disclosure.

FIG. 4 is a plane view illustrating a rigid flexible printed circuit board according to an embodiment of the disclosure.

Figure 5:
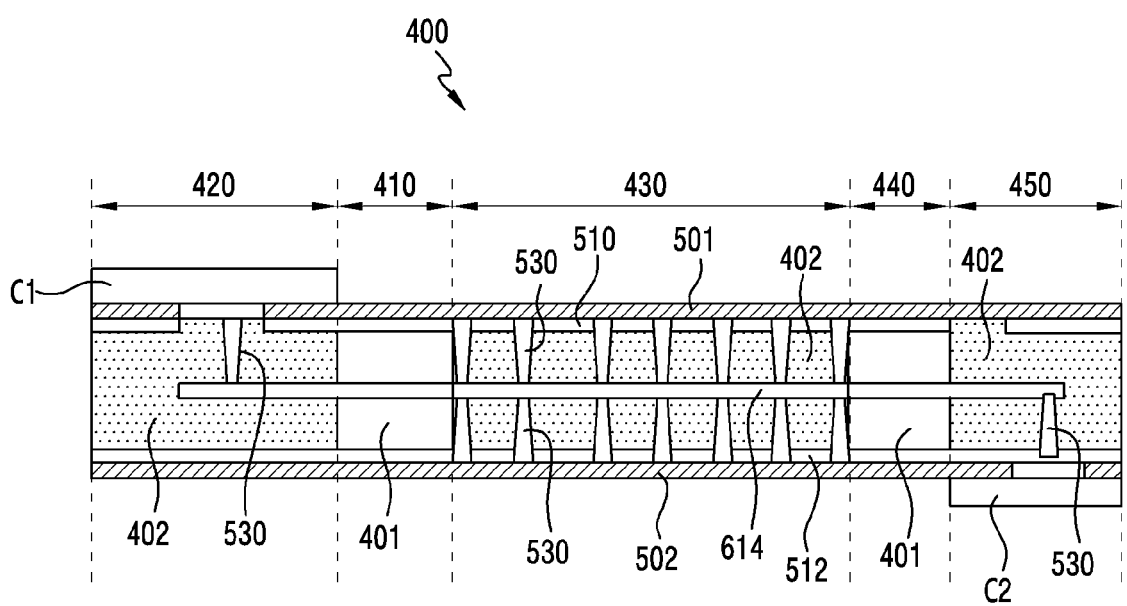
FIG. 5 is a cross-sectional view illustrating the rigid flexible printed circuit board of FIG. 4, cut along line A-A' according to an embodiment of the disclosure, and illustrates a state in which a connector is connected to opposite ends of the rigid flexible printed circuit board.

FIG. 5 is a cross-sectional view illustrating the rigid flexible printed circuit board of FIG. 4, cut along line A-A' according to an embodiment of the disclosure, and illustrates a state in which a connector is connected to opposite ends of the rigid flexible printed circuit board.

Figure 6:
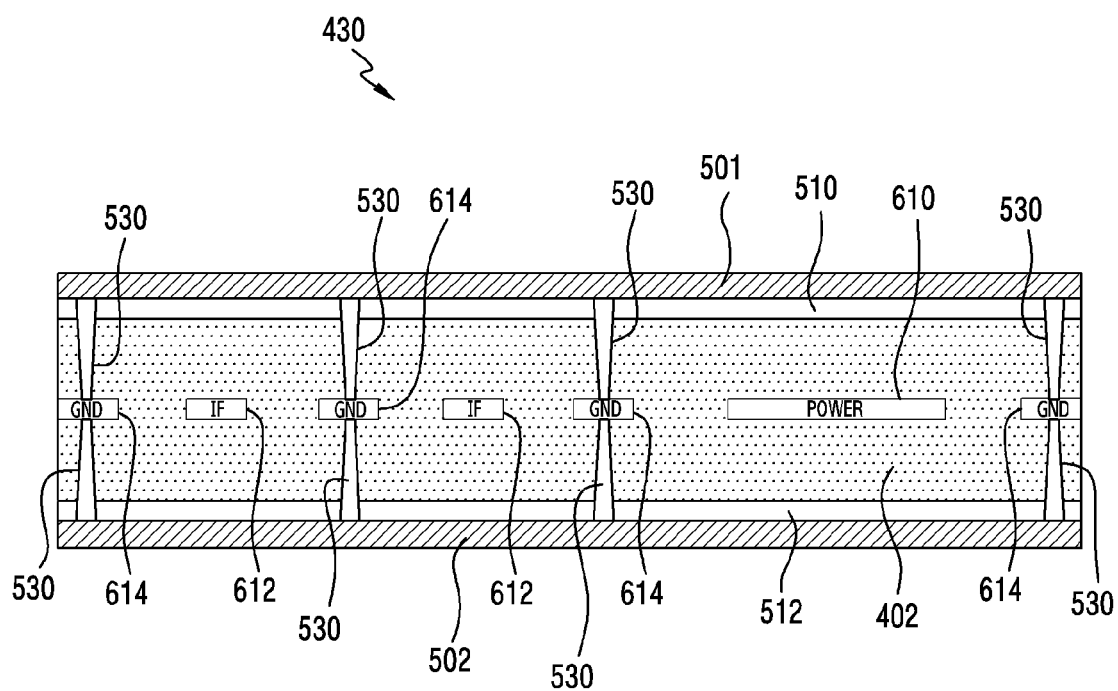
FIG. 6 is a cross-sectional view illustrating the rigid flexible printed circuit board of FIG. 4, cut along line B-B' according to an embodiment of the disclosure.

FIG. 6 is a cross-sectional view illustrating the rigid flexible printed circuit board of FIG. 4, cut along line B-B' according to an embodiment of the disclosure.

Figure 7:
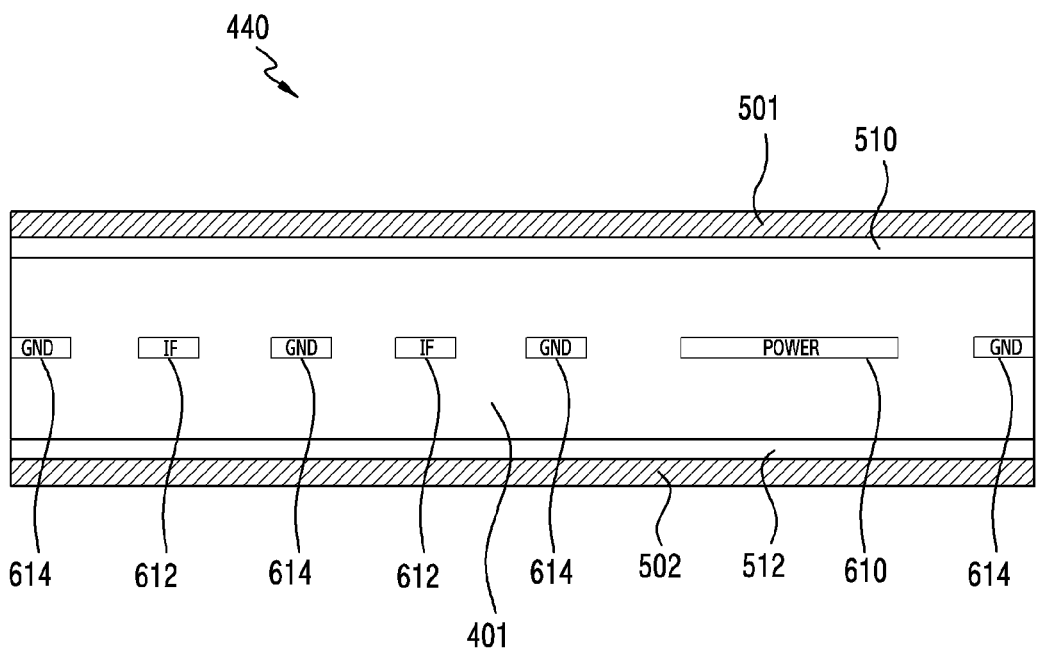
FIG. 7 is a cross-sectional view illustrating the rigid flexible printed circuit board of FIG. 4, cut along line C-C' according to an embodiment of the disclosure.

FIG. 7 is a cross-sectional view illustrating the rigid flexible printed circuit board of FIG. 4, cut along line C-C' according to an embodiment of the disclosure.

Referring to FIGS. 4 to 7, in an embodiment, a rigid flexible printed circuit board 400 may include at least one flexible portion 410 or 440 and at least one rigid portion 420, 430, or 450. According to an embodiment, the rigid portion 430 may be disposed between the flexible portions 410 and 440, and the flexible portion 410 or 440 may be disposed between the rigid portions 420 and 430 or 430 and 450. According to an embodiment, the flexible portion 410 or 440 may include a first dielectric 401 having a first dielectric constant, and the rigid portion 420, 430, or 450 may include a second dielectric 402 having a second dielectric constant.

According to an embodiment, the rigid flexible printed circuit board 400 may include a flexible portion 410 or 440 which is flexible and can be bent, and a rigid portion 420, 430, or 450 which is less flexible than the flexible portion 410 or 440. For example, when the flexible portion 410 or 440 is compared with the rigid portion 420, 430, or 450 in a condition where the width in an x-axis direction, the length in a y-axis direction, and the thickness in a z-axis direction are identical, the flexible portion 410 or 440 may have flexibility greater than that of the rigid portion 420, 430, or 450. According to an embodiment, the rigid portion 420, 430, or 450 may correspond to a rigid portion having rigidity that is not easily bent (or curved). According to various embodiments, the rigid flexible printed circuit board 400 may be formed to omit one of the rigid portions 420, 430, and 450.

According to an embodiment, the rigid flexible printed circuit board 400 may include multiple conductive patterns 610 or 612 in each of the first and second dielectrics 401 and 402. One end of at least a part of the multiple conductive patterns 610 or 612 may be electrically connected to a first connector C1, and the other end of at least a part of the multiple conductive patterns 610 or 612 may be electrically connected to the second connector C2.

According to various embodiments, one end of at least a part of the multiple conductive patterns 610 or 612 may be electrically connected to the first printed circuit board 310 through a conductive bonding material such as solder, without a first connector. According to various embodiments, the other end of at least a part of the multiple conductive patterns 610 or 612 may be electrically connected to the second printed circuit board 370 through a conductive bonding material such as solder, without a second connector.

According to an embodiment, the rigid flexible printed circuit board 400 may be integrally formed with the first printed circuit board 310, and the first connector C1 may be omitted. According to various embodiments, the rigid flexible printed circuit board 400 may be integrally formed with the second printed circuit board 370, and the second connector C2 may be omitted.

In an embodiment, the rigid flexible printed circuit board 400 may include multiple conductive layers 510, 512, or 614 arranged between first and second cover layers 501 and 502. For example, the multiple conductive layers 510, 512, or 614 may include a first conductive layer 510 disposed to be close to the first cover layer 501, a second conductive layer 512 disposed to be close to the second cover layer 502, and a third conductive layer 614 disposed between the first conductive layer 510 and the second conductive layer 512. The first conductive layer 510 may be at least partially disposed along the first cover layer 501. The second conductive layer 512 may be at least partially disposed along the second cover layer 502. The third conductive layer 614 may be disposed to be spaced apart from the first conductive layer 510 and the second conductive layer 512.

In an embodiment, the rigid flexible printed circuit board 400 may include the first cover layer 501 forming at least a part of an upper surface, and a second cover layer 502 forming at least a part of a lower surface. The first cover layer 501 may cover at least a part of the first conductive layer 510, and the second cover layer 502 may cover at least a part of the second conductive layer 512. The first cover layer 501 and the second cover layer 502 may be formed of various insulation materials. The first cover layer 501 may prevent at least a part of the first conductive layer 510 from being exposed to the outside and protect the same from the outside. The second cover layer 502 may prevent at least a part of the second conductive layer 512 from being exposed to the outside and protect the same from the outside.

According to an embodiment, the first conductive layer 510 may be utilized as a first ground layer, the second conductive layer 512 may be utilized as a second ground layer, and the third conductive layer 614 may be utilized as a third ground layer. According to various embodiments, the first conductive layer 510 and the second conductive layer 512 may correspond to a ground plane 313 included in the first printed circuit board 310 of FIG. 3. According to an embodiment, the first conductive layer 510 and the second conductive layer 512 may be electrically connected to a ground plane (not shown) included in the second printed circuit board 370 of FIG. 3.

According to an embodiment, each first conductive layer 510 may be utilized as a conductive pattern layer, and each second conductive layer 512 may be utilized as a conductive pattern layer. According to an embodiment, each of the first and second conductive layers 510 and 512 may be electrically connected through conductive vias 530.

According to an embodiment, the rigid flexible printed circuit board 400 may include multiple conductive vias 530. The conductive vias 530 may correspond to a conductive hole made for the purpose of disposing a connecting wire for electrically connecting the conductive patterns 610 or 612 arranged in different layers. According to an embodiment, the multiple conductive vias 530 may be formed by the rigid portion 420, 430, or 450. The flexible portion 410 or 440 may not include the conductive vias, and thus, a via crack can be prevented.

According to various embodiments, the number or the positions of the conductive vias 530 are not limited to examples illustrated in FIGS. 4 to 6 but may vary.

According to an embodiment, the multiple conductive vias 530 may electrically connect the first conductive layer 510 and the second conductive layer 512 utilized as ground layers. According to an embodiment, the third conductive layer 614 may adjacent to the multiple first conductive patterns 610 and the multiple second conductive patterns 612. The first conductive patterns 610 and the second conductive patterns 612 may be physical separated from each other.

According to various embodiments, a space between the conductive vias 530 is not limited to an example illustrated in FIG. 4 but may vary (e.g., may be formed more densely). According to an embodiment, spaces between the conductive vias 530 formed in the rigid portion 420 may be identical or different, spaces between the conductive vias 530 formed in the rigid portion 430 may be identical or different, and spaces between the conductive vias 530 formed in the rigid portion 450 may be identical or different.

For example, when electromagnetic noise (e.g., electromagnetic wave noise) occurring in the electronic device 30 influences the multiple conductive patterns 610 or 612 corresponding to transmission lines between the second wireless communication circuit 380 and the antenna module 300 of FIG. 3, the performance of wireless communication may deteriorate or it may be difficult to secure signal integrity. The influence by such electromagnetic noise may be more sensitive in high-frequency wireless communication.

According to an embodiment, at least a part of a ground structure including the first conductive layer 510, the second conductive layer 512, the third conductive layer 614, and the multiple conductive vias 530 may reduce the influence exerted to the multiple conductive patterns 610 or 612 due to the electromagnetic noise.

According to an embodiment, at least a part of the ground structure may allow the signal integrity to be secured when a signal is transmitted through the multiple conductive patterns 610 or 612. For example, when IF signals and LO signals transferred between the second wireless communication circuit 380 and the antenna module 300 of FIG. 3 are transmitted or received, at least a part of the ground structure may reduce the influence exerted to transmission or reception of such signals due to electromagnetic noise (e.g., electromagnetic interference (EMI)) occurring in the electronic device 30 or introduced into the electronic device 30. For example, at least a part of the ground structure may reduce a loss in the transmission or reception signals (e.g., IF signals and/or LO signals) between the second wireless communication circuit 380 and the antenna module 300 of FIG. 3.

For example, when power, a signal, or data is transmitted or received through the rigid flexible printed circuit board 400 between the antenna module 300 and the second wireless communication circuit 380, an electric field may be generated in the rigid flexible printed circuit board 400 due to a flow of current. Such electric field may cause noise to a surround circuit, and may thus cause electromagnetic interference which interferes with a normal operation of the surrounding circuit. According to an embodiment, at least a part of the ground structure may reduce the influence exerted to the surrounding circuit due to the electric field generated in the rigid flexible printed circuit board 400. For example, the electronic device 30 of FIG. 3 may include various elements such as a camera module which is adjacent to or is disposed around the rigid flexible printed circuit board 400. At least a part of the ground structure may reduce an electromagnetic influence on an operation clock of a camera module.

In an embodiment, the flexible portion 410 or 440 of the rigid flexible printed circuit board 400 may include a first dielectric 401 filled in spaces among the first conductive layer 510, the second conductive layer 512, or the third conductive layer 614. The first dielectric 401 may insulate the first conductive layer 510, the second conductive layer 512, and the third conductive layer 614 from each other in the flexible portion 410. The first dielectric 401 may connect the first conductive layer 510 and the third conductive layer 614 to each other, and connect the second conductive layer 512 and the third conductive layer 614 to each other in the flexible portion 410.

In an embodiment, the rigid portion 420, 430, or 450 of the rigid flexible printed circuit board 400 may include a second dielectric 402 filled in spaces among the first conductive layer 510, the second conductive layer 512, and the third conductive layer 614. The second dielectric 402 may insulate the first conductive layer 510, the second conductive layer 512, and the third conducive layer 614 from each other in the rigid portion 420, 430, or 450. The second dielectric 402 may connect the first conductive layer 510 and the third conductive layer 614 to each other, and connect the second conductive layer 512 and the third conductive layer 614 to each other in the rigid portion 420, 430, or 450.

According to an embodiment, the first dielectric 401 is flexible, and thus, the flexible portion 410 or 440 may have flexibility by the first dielectric 401. According to an embodiment, the second dielectric 402 may be less flexible than the first dielectric 401. The rigid portion 420, 430, or 450 may be implemented as a rigid portion which is not easily bent (or curved) by the second dielectric 402. The first dielectric 401 may be formed of an insulation bonding material that is different from that of the second dielectric 402.

According to an embodiment, the first dielectric 401 may have a first dielectric constant, and the second dielectric 402 may have a second dielectric constant. According to an embodiment, a discrepancy between the first dielectric constant and the second dielectric constant is within a configured range, or the first dielectric constant or the second dielectric constant may be substantially similar or identical to each other. According to various embodiments, the first dielectric constant that the first dielectric 401 has may be different from the second dielectric constant that the second dielectric 402 has. According to various embodiments, the first dielectric 401 and the second dielectric 402 may be substantially similar (or identical) to each other, or may have at least one of different characteristics (e.g., insulation, rigidity, or flexibility).

According to an embodiment, the flexible portion 410 or 440 and the rigid portion 420, 430, or 450 of the rigid flexible printed circuit board 400 may have substantially the same impedance (e.g., impedance matching). The impedance matching between the flexible portion 410 or 440 and the rigid portion 420, 430, or 450 can minimize a power loss or efficiently transfer signals when the signals are transmitted or received through the multiple conductive patterns 610 or 612 corresponding to transmission lines between the first wireless communication circuit 340 and the second wireless communication circuit 380 of FIG. 3. The impedance matching between the flexible portion 410 or 440 and the rigid portion 420, 430, or 450 may lead to an efficient flow of a signal in a designated or selected frequency (or resonance frequency) between the first wireless communication circuit 340 and the second wireless communication circuit 380 of FIG. 3. The impedance matching between the flexible portion 410 or 440 and the rigid portion 420, 430, or 450 can reduce a loss in a signal (e.g., a frequency signal) having a designated or selected frequency between the first wireless communication circuit 340 and the second wireless communication circuit 380 of FIG. 3 or can secure signal integrity.

In the flexible portion 410 or 440 of the rigid flexible printed circuit board 400, the first dielectric 401 having the first dielectric constant may be disposed between the multiple conductive patterns 610 or 612, and the impedance corresponding to a designated frequency may be generated between two conductive patterns among the multiple conductive patterns 610 or 612. According to an embodiment, a signal (e.g., a frequency signal) transmitted or received through the rigid flexible printed circuit board 400 between the antenna module 300 and the second wireless communication circuit 380 of FIG. 3 may have the designated frequency and the impedance.

According an embodiment, the rigid flexible printed circuit board 400 having the flexible portion 410 or 440 and the rigid portion 420, 430, or 450 may be formed through a process (e.g., hot pressing) in which the first conductive layer 510, the second conductive layer 512, and the third conductive layer 614 are bonded with heat and pressure by using a first insulation bonding material and a second insulation bonding material having insulation functions. The first dielectric 401 may be formed by the first insulation bonding material, and the second dielectric 402 may be formed by the second insulation bonding material. According to an embodiment, in order to secure a bond strength between the first dielectric 401 and the second dielectric 402 formed through the hot pressing process, the first insulation bonding material and the second insulation bonding material may be selected. The bond strength may include a mechanical strength indicating resistance to destruction by an external force or an environmental strength indicating resistance to destruction by an environment (e.g., heat). The bond strength may indicate a coupling force (bonding force) (e.g., an interfacial coupling force) of an interface formed between the first dielectric 401 and the second dielectric 402. According to an embodiment, the first insulation bonding material and the second insulation bonding material may be coupled through affinity between molecules when heat and pressure are applied to the bonding.

According to an embodiment, in order to secure the bond strength between the first dielectric 401 and the second dielectric 402 formed by the hot pressing process, the first insulation bonding material and the second insulation bonding material may be selected in consideration of thermal characteristics such as a glass transition temperature (Tg), a cold crystallization temperature (Tcc), a melting temperature (Tm), a crystallization temperature (Tc), or a crystallization time.

According to an embodiment, in order to secure the bond strength between the first dielectric 401 and the second dielectric 402 formed by the hot pressing process, the first insulation bonding material for forming the first dielectric 401 and the second insulation bonding material for forming the second dielectric 402 may be at least similar or identical to each other, or may have different thermal characteristics. For example, the first glass transition temperature that the first insulation bonding material has may be lower or higher than a second glass transition temperature that the second insulation bonding material has. In another example, the first glass transition temperature may be substantially similar or identical to the second glass transition temperature.

According to an embodiment, the first insulation bonding material for forming the first dielectric 401 and/or the second insulation bonding material for forming the second dielectric 402 may include a polymer (or a resin). For example, the first insulation bonding material may include a first polymer which allows the first dielectric 401 to have flexibility. For example, the second insulation bonding material may include a second polymer which allows the second dielectric 402 to have rigidity so that the second dielectric 402 is not easily bent (or curved).

According to various embodiments, the first insulation bonding material for forming the first dielectric 401 and/or the second insulation bonding material for forming the second dielectric 402 may include a thermoplastic resin. The thermoplastic resin may correspond to a resin which can change, when heat is applied again, a shape again even after molding performed by applying heat. For example, when heat is applied again after the hardening, the thermoplastic resin can be softened after going through the glass transition temperature.

According to various embodiments, the first insulation bonding material for forming the first dielectric 401 and/or the second insulation bonding material for forming the second dielectric 402 may include a thermosetting resin (e.g., a phenolic resin or an epoxy resin). The thermosetting resin may correspond to a resin, the shape of which is difficult to be changed even through heat is applied again once the hardening and the molding are performed by applying heat.

According to an embodiment, the first insulation bonding material for forming the first dielectric 401 may include a liquid crystal polymer (LCP). The LCP may correspond to a polymer indicating liquidity in a solution or in a melted state. The first dielectric 401 formed in the LCP may have flexibility, a high-frequency characteristic (or a high-frequency reaction capability), insulation, high speed data transmission or reception, heat and water durability, or dimensional stability.

According to an embodiment, the second insulation bonding material for forming the second dielectric 402 may include prepreg. The prepreg may correspond to a material obtained by inundating a fabric enhancer (e.g., a reinforcing substrate) such as carbon fiber or glass fiber in a liquid synthetic resin. For example, the fiber enhancer may increase the rigidity (e.g., longitudinal and transvers direction rigidity) of the second dielectric 402 which has insufficient rigidity only with the resin, or may reduce a dimensional change rate of the second dielectric 402 with respect to the temperature. For example, the prepreg may include a thermosetting resin system such as a phenol resin or an epoxy resin, and a thermoplastic resin system such as polyetherketone. The prepreg may include, for example, a unidirectional prepreg and a cross-prepreg.

According to various embodiments, the first insulation bonding material for forming the first dielectric 401 may react to heat or pressure so as to be closely coupled to the second insulation bonding material for forming the second dielectric 402 in the hot pressing process. According to various embodiments, the second insulation bonding material for forming the second dielectric 402 may react to heat or pressure so as to be closely coupled to the first insulation bonding material for forming the first dielectric 401 in the hot pressing process.

According to various embodiments, in the hot pressing process, first modulus that the first insulation bonding material has in order to form the first dielectric 401 may be substantially similar or identical to second modulus that the second insulation bonding material has in order to form the second dielectric 402. According to various embodiments, in the hot pressing process, the first modulus may be different from the second modulus.

According to various embodiments, the rigid flexible printed circuit board 400 is not limited to an example in FIG. 3 in which the antenna module 300 and the second wireless communication module 382 are electrically connected to each other, and may be utilized in electrically connecting various different electrical elements to each other.

Figure 8A:
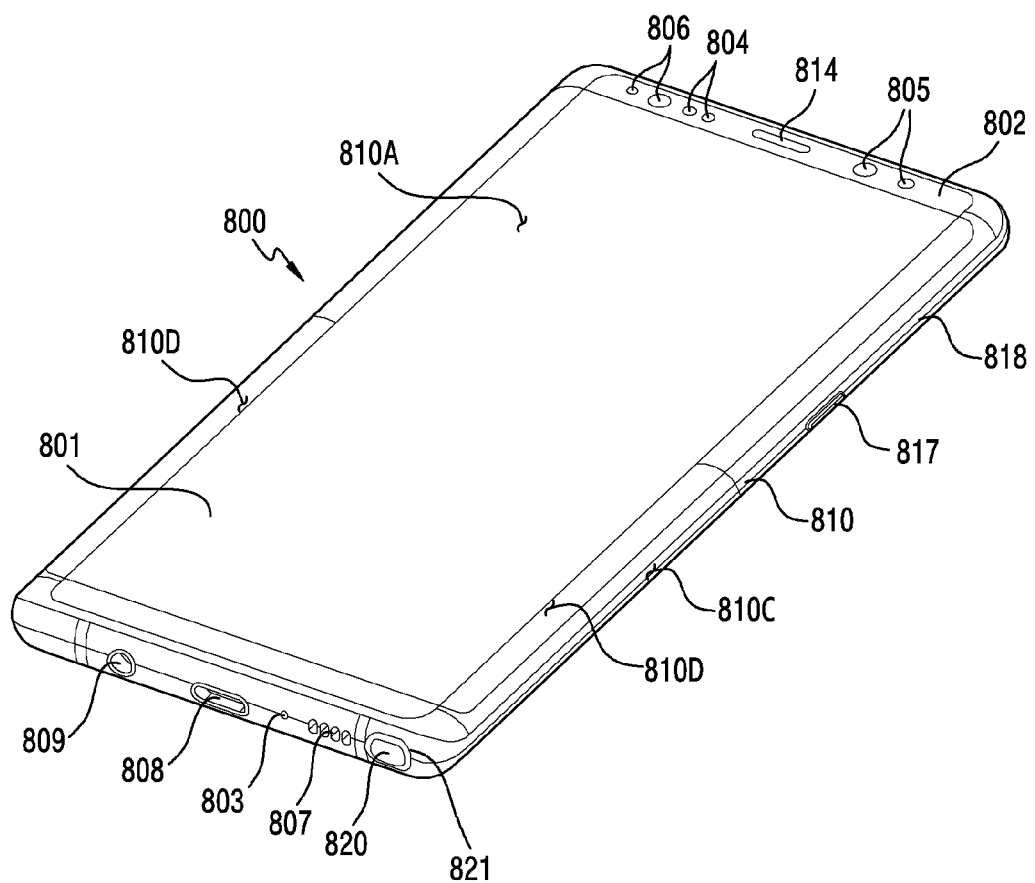
FIG. 8A is a perspective view illustrating a front surface of an electronic device according to an embodiment of the disclosure.

FIG. 8A is a perspective view illustrating a front surface of an electronic device according to an embodiment of the disclosure.

Figure 8B:
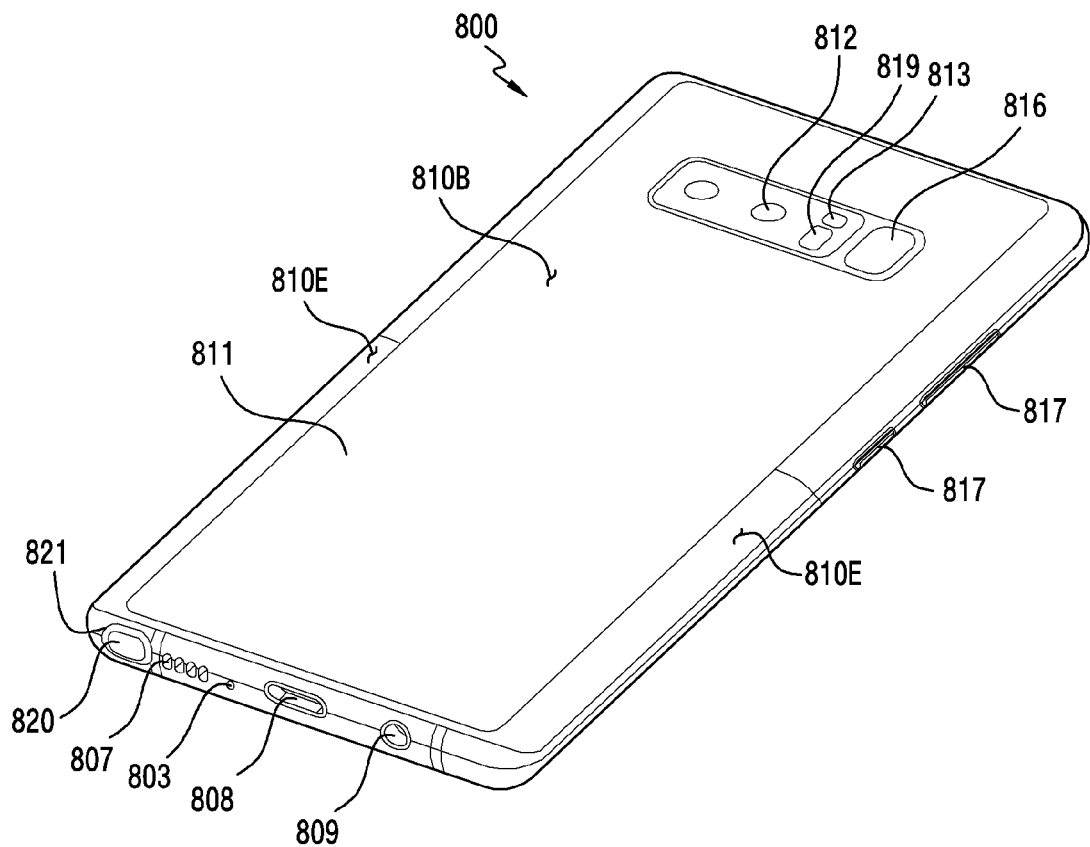
FIG. 8B is a perspective view illustrating a rear surface of an electronic device according to an embodiment of the disclosure.

FIG. 8B is a perspective view illustrating a rear surface of an electronic device according to an embodiment of the disclosure.

Referring to FIGS. 8A and 8B, an electronic device 800 (e.g., the electronic device 101 of FIG. 1 or the electronic device 30 of FIG. 3) according to an embodiment may include a housing 810 including a first surface (or a front surface) 810A, a second surface (a rear surface) 810B, and a side surface 810C surrounding a space between the first surface 810A and the second surface 810B. In another embodiment, the housing 810 may refer to a structure forming a part of the first surface 810A, the second surface 810B, and the side surface 810C of FIG. 8A. According to an embodiment, the first surface 810A may be formed by a front plate 802 (e.g., a glass plate or a polymer plate including various coating layers) having at least a part which is substantially transparent. The second surface 810B may be formed by a rear plate 811 which is substantially opaque. The rear plate 811 may be formed of, for example, coated or colored glass, ceramic, polymer, metal (e.g., aluminum, stainless steel (STS), or magnesium), or a combination of two or more thereof. The side surface 810C may be formed by a side bezel structure (or a "side member") 818 coupled to the front plate 802 and the rear plate 811 and including metal and/or polymer. In some embodiments, the rear plate 811 and the side bezel structure 818 may be integrally formed and may include the same material (e.g., a metallic material such as aluminum).

In the illustrated embodiment, the front plate 802 may include two first areas 810D seamlessly extended by being bent from the first surface 810A toward the rear plate 811 at both ends of a long edge of the front plate 802. In the illustrated embodiment (see FIG. 8B), the rear plate 811 may include two second areas 810E seamlessly extended by being bent from the second surface 810B toward the front plate 802 at both ends of a long edge. In some embodiments, the front plate 802 (or the rear plate 811) may include only one of the first areas 810D (or the second areas 810E). In another embodiment, some of the first areas 810D or the second areas 810E may not be included. In an embodiment, when being seen from a side surface of the electronic device 800, the side bezel structure 818 may have a first thickness (or width) at a side in which the first areas 810D or the second areas 810E are not included, and may have a second thickness thinner than the first thickness at a side in which the first areas 810D or the second areas 810E are included.

According to an embodiment, the electronic device 800 may include at least one of a display 801, audio modules 803, 807, and 814, sensor modules 804, 816, and 819, camera modules 805, 812, and 813, key input devices 817, a light emitting element 806, a pen input device 820, or connector holes 808 and 809. In some embodiments, the electronic device 800 may omit at least one element (e.g., the key input devices 817 or the light emitting element 806), or other elements may be additionally included.

The display 801 may be exposed through, for example, some portions of the front plate 802. In some embodiments, at least a part of the display 801 may be exposed through the first surface 810A and the front plate 802 forming the first areas 810D of the side surface 810C. In some embodiments, a corner of the display 801 may be formed to be substantially identical to a shape of an adjacent perimeter of the front plate 802. In another embodiment (not shown), a spacing between the outer perimeter of the display 801 and the outer perimeter of the front plate 802 may formed to be substantially identical in order to extend an area to which the display 801 is exposed.

In some embodiments, a part of a screen display area of the display 801 may have a recess or opening formed therein, and may include at least one of the audio module 814, the sensor module 804, the camera module 805, and the light emitting element 806 which are aligned with the recess or the opening. In another embodiment, a rear surface of the screen display area of the display 801 may include at least one of the audio module 814, the sensor module 804, the camera module 805, the fingerprint sensor (i.e., sensor module 816), or the light emitting element 806. In another embodiment, the display 801 may be disposed adjacent to or coupled to a touch sensing circuit, a pressure sensor capable of measuring a touch strength (pressure), and/or a digitizer for detecting a magnetic-type stylus pen. In some embodiments, at least a part of the sensor modules 804 and 819 and/or at least a part of the key input devices 817 may be disposed on the first areas 810D and/or the second areas 810E.

The audio modules 803, 807, and 814 may include, for example, a microphone hole 803 and speaker holes 807 and 814. The microphone hole 803 may have a microphone disposed therein to acquire external sound, and in some embodiments, may have multiple microphones arranged therein to detect the direction of the sound. The speaker holes 807 and 814 may include the external speaker hole 807 and the receiver hole 814 for a call. In some embodiments, the speaker holes 807 and 814 and the microphone hole 803 may be implemented as a single hole, or a speaker (e.g., a piezo speaker) may be included without the speaker holes 807 and 814.

The sensor modules 804, 816, and 819 may generate, for example, an electrical signal or a data value corresponding to an internal operational state of the electronic device 800 or an external environmental state. The sensor modules 804, 816, and 819 may include, for example, a first sensor module 804 (e.g., a proximity sensor) and/or a second sensor module (not shown) (e.g., a fingerprint sensor) disposed on the first surface 810A of the housing 810, and/or a third sensor module 819 (e.g., a heart rate monitoring (HRM) sensor) and/or a fourth sensor module 816 (e.g., a fingerprint sensor) disposed on the second surface 810B of the housing 810. The fingerprint sensor may be disposed not only on the first surface 810A (e.g., the display 801) but also on the second surface 810B of the housing 810. The electronic device 800 may further include a sensor module which is not shown, for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor 804.

The camera modules 805, 812, and 813 may include, for example, a first camera module 805 disposed on the first surface 810A of the electronic device 800, a second camera module 812 disposed on the second surface 810B, and/or a flash 813. The camera modules 805 and 812 may include one or more lenses, an image sensor, and/or an image signal processor. The flash 813 may include, for example, a light emitting diode (LED) or a xenon lamp. In some embodiments, two or more lenses (e.g., infrared cameras and wide angle and telephoto lenses) and image sensors may be arranged on one surface of the electronic device 800.

The key input devices 817 may be arranged on, for example, the side surface 810C of the housing 810. In another embodiment, the electronic device 800 may not include some or all of the above-mentioned key input devices 817, and the key input devices 817, which is not included, may be implemented on the display 801 in another form such as a soft key. In some embodiments, the key input device may include the sensor module 816 disposed on the second surface 810B of the housing 810.

The light emitting element 806 may be disposed on, for example, the first surface 810A of the housing 810. The light emitting element 806 may provide, for example, state information of the electronic device 800 in an optical form. In another embodiment, the light emitting element 806 may provide, for example, a light source in connection with an operation of the camera module 805. The light emitting element 806 may include, for example, an LED, an IR LED, or a xenon lamp.

The connector holes 808 and 809 may include, for example, the first connector hole 808 capable of receiving a connector (for example, a USB connector) for transmitting or receiving power and/or data to or from an external electronic device, and/or the second connector hole 809 (for example, an earphone jack) capable of receiving a connector for transmitting or receiving an audio signal to or from the external electronic device.

The pen input device 820 (e.g., a stylus pen) may be guided inside the housing 810 through a hole 821 formed through the side surface of the housing 810, so as to be inserted thereinto or attached or detached thereto or therefrom, and may include a button which facilitates the attachment or detachment. The pen input device 820 may have a separate resonance circuit mounted therein so that the resonance circuit can be linked to an electromagnetic induction panel (e.g., a digitizer) included in the electronic device 800. The pen input device 820 may include an electromagnetic resonance (EMR) type, an active electrical stylus (AES), or an electric coupled resonance (ECR) type.

According to an embodiment, the electronic device 800 may include at least one rigid flexible printed circuit board (not shown) (e.g., the rigid flexible printed circuit board 400 of FIG. 4) for electrically connecting electrical elements to each other. The rigid flexible printed circuit board 400 may include at least a part of the structure suggested in FIGS. 4 to 7.

Figure 9:
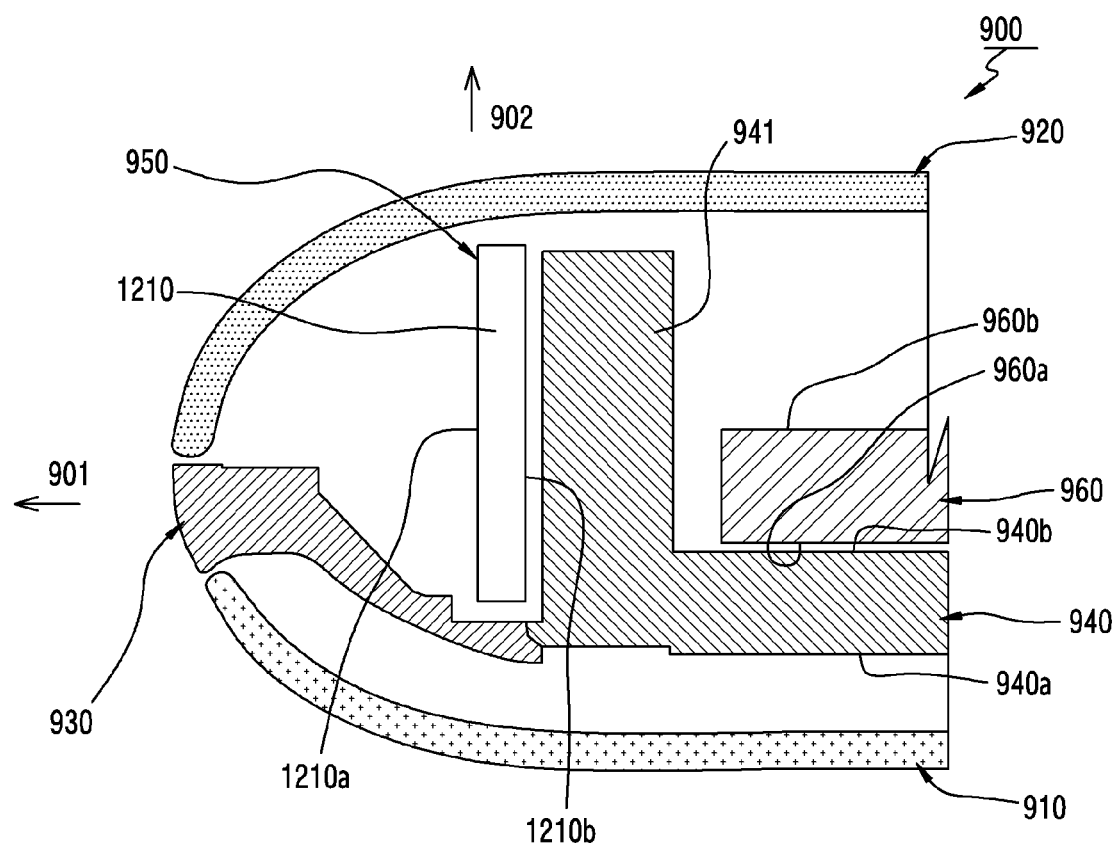
FIG. 9 is a cross-sectional view illustrating an electronic device according to an embodiment of the disclosure.

FIG. 9 is a cross-sectional view illustrating an electronic device according to an embodiment of the disclosure.

Figure 10:
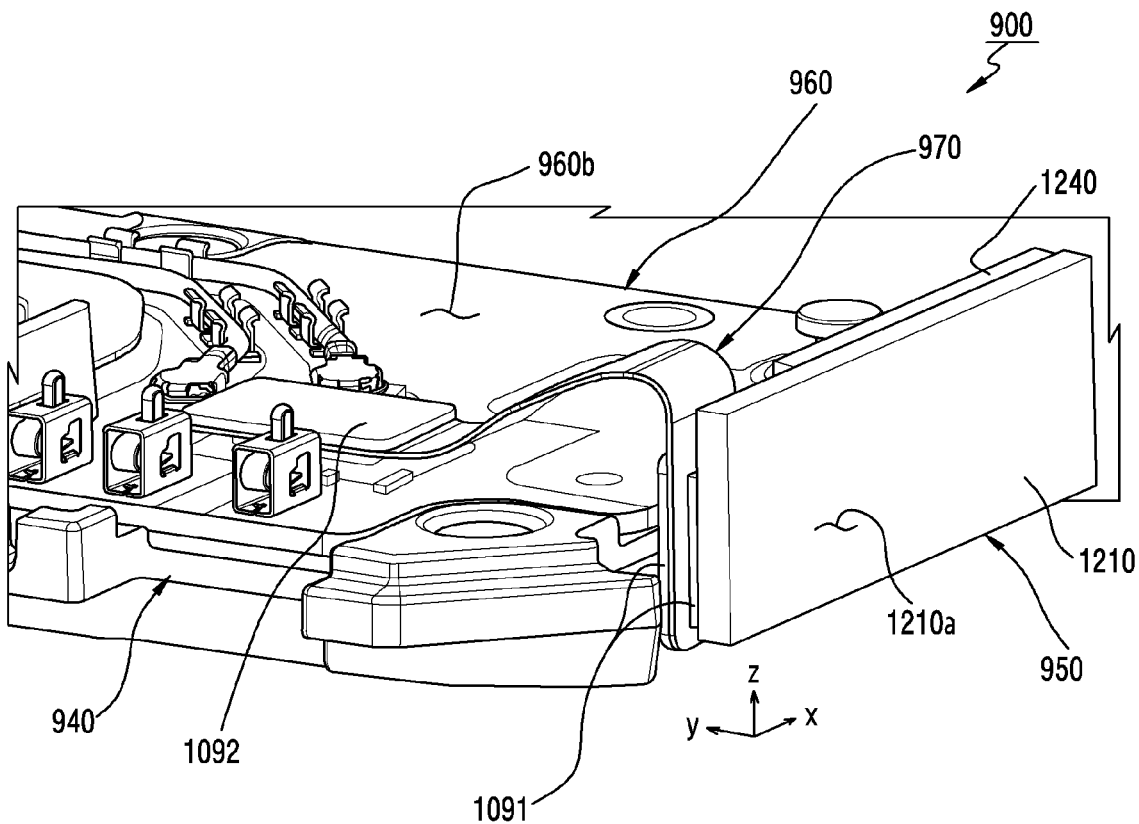
FIGS. 10 and 11 illustrate some parts of an electronic device according to various embodiments of the disclosure.
Figure 11:
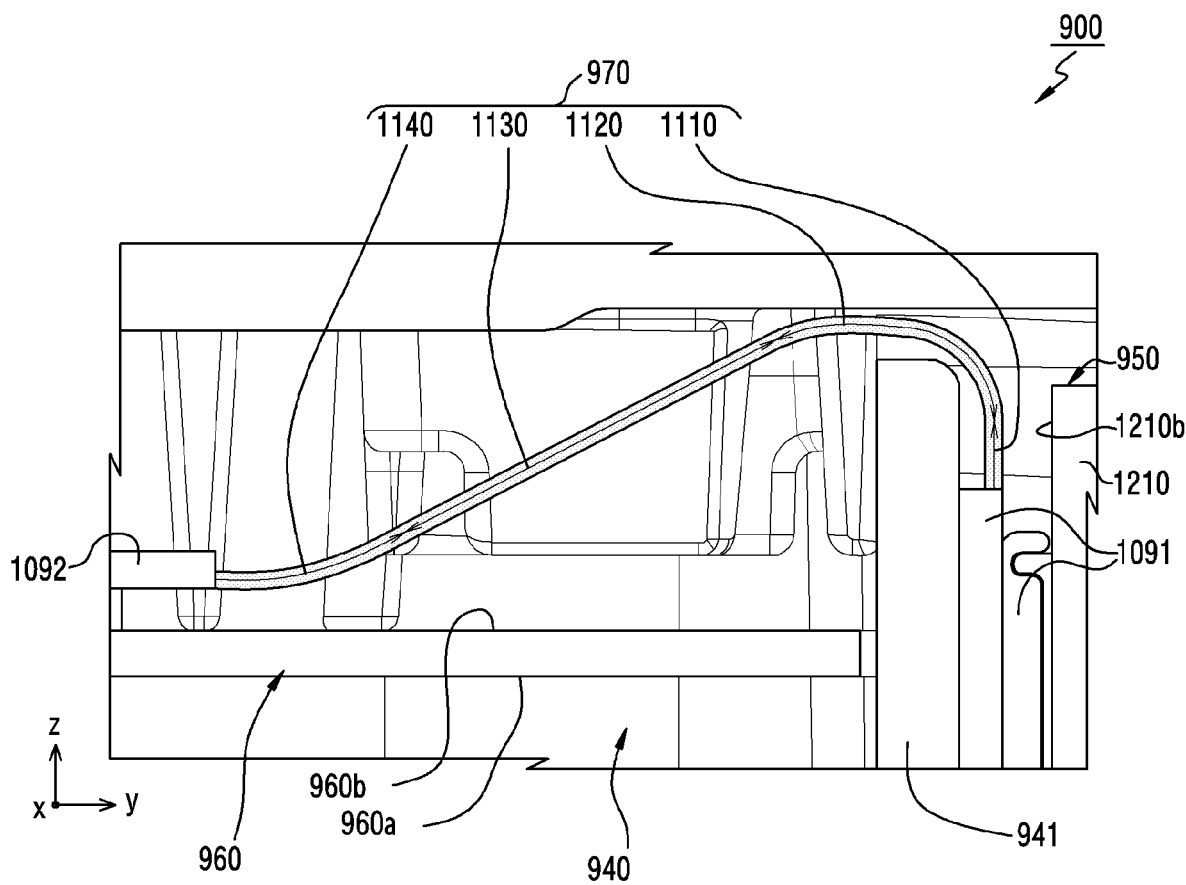

FIGS. 10 and 11 are perspective views illustrating some parts of an electronic device according to various embodiments of the disclosure.

Referring to FIGS. 9 to 11, in an embodiment, an electronic device 900 (e.g., the electronic device 101 of FIG. 1 or the electronic device 30 of FIG. 3) may include at least one of a first plate 910, a second plate 920, a side bezel structure 930, a supporting member 940, an antenna module 950 (e.g., the antenna module 300 of FIG. 3), a second printed circuit board 960 (e.g., the second printed circuit board 370 of FIG. 3), or a rigid flexible printed circuit board 970 (e.g., the rigid flexible printed circuit board 400 of FIG. 4).

The first plate 910 may correspond to, for example, the front plate 802 of FIG. 8A, and a detailed description thereof will be omitted. The second plate 920 may correspond to, for example, the rear plate 811 in FIG. 8B, and a detailed description thereof will be omitted.

According to an embodiment, the supporting member 940 (e.g., a bracket) may be disposed in the electronic device 900 to be connected to the side bezel structure 930, or may be integrally formed with the side bezel structure 930. The supporting member 940 may be formed of, for example, a metal material and/or a non-metal material (e.g., polymer). The supporting member 940 may include one surface 940a on which a display (not shown) (e.g., the display 801 of FIG. 8A) is disposed, and the other surface 940b on which the second printed circuit board 960 is disposed. The second printed circuit board 960 may have a processor (e.g., the processor 120 of FIG. 1), a memory (e.g., the memory 130 of FIG. 1), and/or an interface (e.g., the interface 177 of FIG. 1) disposed thereon.

According to an embodiment, the second printed circuit board 960 may include a third surface 960a facing the supporting member 940 and a fourth surface 960b facing in the direction opposite to the third surface 960a. According to various embodiments, the second printed circuit board 960 may correspond to the second printed circuit board 370 of FIG. 3, and a detailed description thereof will be omitted. For example, the processor 301, the power management module 302, or the memory 303 of FIG. 3 may be disposed on the second printed circuit board 960.

According to an embodiment, the antenna module 950 may include a first printed circuit board 1210 (e.g., the first printed circuit board 310 of FIG. 3). The first printed circuit board 1210 may include a first surface 1210a and a second surface 1210b facing in the direction opposite to the first surface 1210a. According to an embodiment, the first printed circuit board 1210 may be disposed to be substantially perpendicular to the second printed circuit board 960. For example, the first surface 1210a (or the second surface 1210b) of the first printed circuit board 1210 may be perpendicular to the third surface 960a or the fourth surface 960b of the second printed circuit board 960. According to an embodiment, the supporting member 940 may include a part 941 extending between the first printed circuit board 1210 and the second printed circuit board 960, and the first printed circuit board 1210 may be disposed to at least partially correspond to the part 941.

According to various embodiments, the first printed circuit board 1210 may be disposed at an acute angle or an obtuse angle with respect to the second printed circuit board 960. For example, the first surface 1210a (e.g., the second surface 1210b) of the first printed circuit board 1210 may be at an acute angle or an obtuse angle with respect to the third surface 960a or the fourth surface 960b of the second printed circuit board 960.

According to various embodiments, the first printed circuit board 1210 may be disposed to be parallel to the second printed circuit board 960. For example, the first surface 1210a (e.g., the second surface 1210b) of the first printed circuit board 1210 may be substantially parallel to the third surface 960*a* or the fourth surface 960*b* of the second printed circuit board 960.

In an embodiment, the electronic device 900 may include a third connector 1091 disposed on one end of the rigid flexible printed circuit board 970 (e.g., the rigid flexible printed circuit board 400 of FIG. 4) and a fourth connector 1092 disposed on the other end of the rigid flexible printed circuit board 970. The third connector 1091 may be electrically connected to a first connector (e.g., the first connector 391 of FIG. 3 or a first connector 1291 of FIG. 12B) disposed on the first printed circuit board 1210, and the fourth connector 1092 may be electrically connected to a second connector (e.g., the second connector 392 of FIG. 3) disposed on the second printed circuit board 960. According to an embodiment, the rigid flexible printed circuit board 970 may be implemented to be substantially similar or identical to the rigid flexible printed circuit board 400 of FIG. 4.

In an embodiment, the rigid flexible printed circuit board 970 may include a first rigid portion 1110, a first flexible portion 1120, a second rigid portion 1130, or a second flexible portion 1140. The first flexible portion 1120 may be disposed between the first rigid portion 1110 and the second rigid portion 1130, and the second rigid portion 1130 may be disposed between the first flexible portion 1120 and the second flexible portion 1140. The third connector 1091 may be connected to the first flexible portion 1120 and the fourth connector 1092 may be connected to the second flexible portion 1140.

According to an embodiment, the first flexible portion 1120 or the second flexible portion 1140 may be implemented to be substantially similar or identical to the flexible portion 410 of the rigid flexible printed circuit board 400 of FIG. 4. According to an embodiment, the first rigid portion 1110 or the second rigid portion 1130 may be implemented to be substantially similar or identical to the rigid portion 420 or the third rigid portion 430 of the rigid flexible printed circuit board 400 of FIG. 4. The rigid flexible printed circuit board 970 may be disposed on the electronic device 900, wherein the first flexible portion 1120 and the second flexible portion 1140 are bent. According to an embodiment, the first flexible portion 1120 and the second flexible portion 1140 may not include conductive vias, and the first rigid portion 1110 and/or the second rigid portion 1130 may include conductive vias (e.g., the multiple conductive vias 530 of FIG. 4). The conductive vias may electrically connect the multiple ground layers to each other, the layers being included in the rigid flexible printed circuit board 970.

According to an embodiment, the first flexible portion 1120 and the second flexible portion 1140 may not include the conductive vias which can prevent a via crack. According to an embodiment, the first flexible portion 1120 and the second flexible portion 1140 may have a first dielectric disposed between multiple conductive patterns (e.g., the multiple conductive patterns 610 and 612 of FIG. 4) and allowing the first flexible portion 1120 and the second flexible portion 1140 to have flexibility. According to an embodiment, the first rigid portion 1110 and the second rigid portion 1130 may include a second dielectric (e.g., the second dielectric 402 of FIG. 5) disposed between the multiple conductive patterns and allowing the first rigid portion 1110 and the second rigid portion 1130 to have rigidity so as not be easily bent. For example, after the multiple conductive layers having the corresponding patterns are aligned, a first insulation bonding material for forming the first dielectric between the multiple conductive layers and a second insulation bonding material for forming the second dielectric may be arranged and then go through a hot pressing process, so that the rigid flexible printed circuit board 970 is formed. According to an embodiment, in order to secure a bond strength between the first dielectric and the second dielectric, the first insulation bonding material and/or the second insulation bonding material which react to heat and/or the pressure in the hot pressing process may be selected. According to an embodiment, the first insulation bonding material may include a liquid crystal polymer (LCP), and the second insulation bonding material may include prepreg. According to an embodiment, as compared to the first rigid portion 1110 and the second rigid portion 1130, the first flexible portion 1120 and the second flexible portion 1140 include the first dielectric formed of the liquid crystal polymer so that a loss in a transmission or reception signal through multiple conductive patterns can be reduced even through the multiple conductive vias for electrically connecting ground layers to each other are not included. For example, a first dielectric constant that the first dielectric has may allow the impedance of the first flexible portion 1120 and the second flexible portion 1140 to be substantially identical to the impedance (or the impedance of the first rigid portion 1110 and the second rigid portion 1130) corresponding to a designated frequency.

Figure 12A:
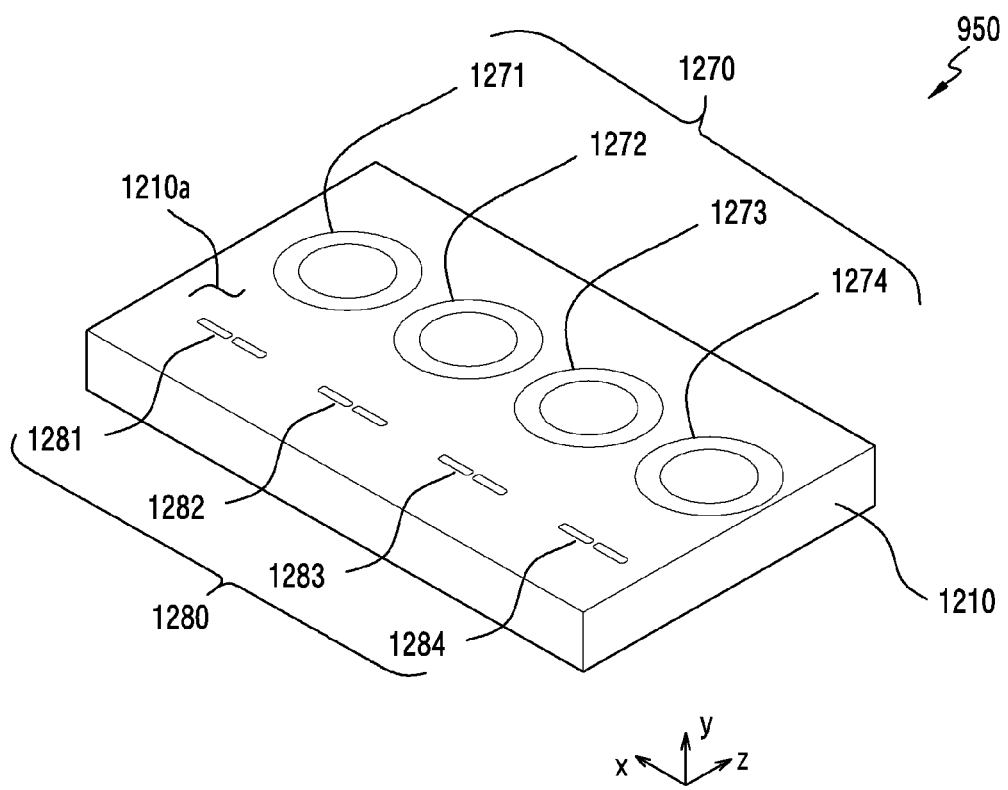
FIG. 12A is a perspective view illustrating a front surface of an antenna module according to an embodiment of the disclosure.

FIG. 12A is a perspective view illustrating a front surface of an antenna module according to an embodiment of the disclosure.

Figure 12B:
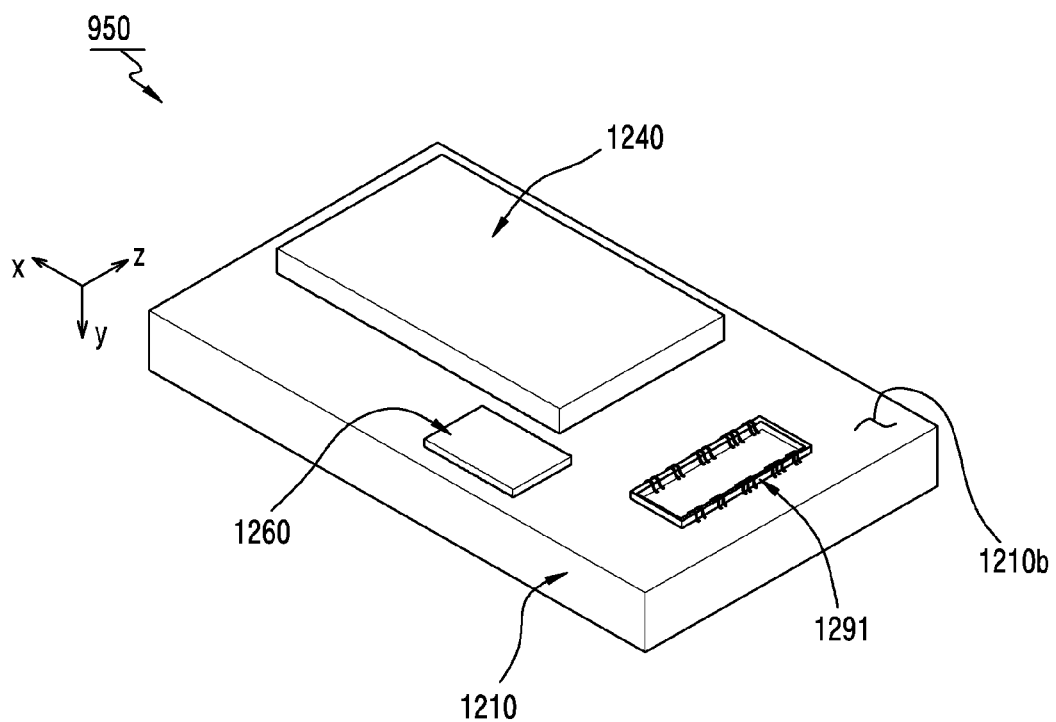
FIG. 12B is a perspective view illustrating a rear surface of an antenna module according to an embodiment of the disclosure.

FIG. 12B is a perspective view illustrating a rear surface of an antenna module according to an embodiment of the disclosure.

Referring to FIGS. 12A and 12B, in an embodiment, an antenna module 950 (e.g., the antenna module 300 of FIG. 3) may include at least one of a first printed circuit board 1210 (e.g., the first printed circuit board 310 of FIG. 3), a first wireless communication circuit 1240 (e.g., the first wireless communication circuit 340 of FIG. 3), a power management circuit 1260 (e.g., the power management circuit 360 of FIG. 3), or a first connector 1291 (e.g., the first connector 391 of FIG. 3).

According to an embodiment, the first printed circuit board 1210 may include at least one of a first antenna array 1270 (e.g., the first antenna array 311 of FIG. 3) or a second antenna array 1280 (e.g., the second antenna array 312 of FIG. 3). According to an embodiment, the first antenna array 1270 may include multiple antenna elements 1271, 1272, 1273, and 1274 implemented as at least some of multiple conductive layers of the first printed circuit board 1210. According to an embodiment, the second antenna array 1280 may include multiple antenna elements 1281, 1282, 1283, and 1284 implemented as at least some of the multiple conductive layers of the first printed circuit board 1210.

According to an embodiment, the first wireless communication circuit 1240 may be disposed on or coupled to the second surface 1210*b* of the first printed circuit board 1210 through a conductive bonding member (e.g., the conductive bonding member 350 of FIG. 3) such as solder, and may be electrically connected to the first printed circuit board 1210. The first wireless communication circuit 1240 may be electrically connected to the first antenna array 1270 and the second antenna array 1280 through wires included in the first printed circuit board 1210. According to an embodiment, the first antenna array 1270 and/or the second antenna array 1280 may be disposed to be closer to the first surface 1210*a* than the second surface 1210*b*.

According an embodiment, the power management circuit 1260 may be disposed on or coupled to the second surface 1210b of the first printed circuit board 1210 through a conductive bonding member (e.g., the conductive bonding member 361) such as solder, and may be electrically connected to the first printed circuit board 1210. The power management circuit 1260 may be electrically connected to the first wireless communication circuit 1240, the first connector 1291, or various other elements (e.g., passive devices) arranged on the first printed circuit board 1210, through at least one conductive layer included in the first printed circuit board 1210.

According to an embodiment, the first connector 1291 may be disposed on or coupled to the second surface 1210b of the first printed circuit board 1210 through a conductive bonding member (e.g., the conductive bonding member 362 of FIG. 3) such as solder, and may be electrically connected to the first printed circuit board 1210. The first connector 1291 may be electrically connected to the first wireless communication circuit 1240, the power management circuit 1260, or various other elements arranged on the first printed circuit board 1210, through at least one conductive layer included in the first printed circuit board 1210.

According to an embodiment, the multiple antenna elements 1271, 1272, 1273, and 1274 included in the first antenna array 1270 or the multiple antenna elements 1281, 1282, 1283, and 1284 included in the second antenna array 1280 may include, for example, patch antennas, loop antennas, or dipole antennas.

According to various embodiments, the positions or the number of antenna arrays are not limited to the example illustrated in FIG. 12A but may vary. According to various embodiments, the positions or the number of antennas included in the first antenna array 1270 or the second antenna array 1280 are not limited to the example illustrated in FIG. 12A but may vary.

According to an embodiment, the second wireless communication module 382 of FIG. 3 or the first wireless communication circuit 1240 of FIG. 9, 10, or 12b may include a beamforming system for processing a transmission or reception signal so that energy radiated from the multiple antenna elements 1271, 1272, 1273, and 1274 of the first antenna array 1270 or the multiple antenna elements 1281, 1282, 1283, and 1284 of the second antenna array 1280 are concentrated in free space in a specific direction. The beamforming system may cause a signal having a stronger strength to be received in a desired direction, a signal to be transferred in a desired direction, or a signal coming from an undesired direction not to be received. For example, the beamforming system may adjust the phase of current supplied to the multiple antenna elements 1271, 1272, 1273, and 1274 of the first antenna array 1270 or the multiple antenna elements 1281, 1282, 1283, and 1284 of the second antenna array 1280 so as to form the direction of a beam (e.g., a main lobe).

For example, referring to FIG. 9, by the beamforming system, the antenna module 950 may form a beam so that a relatively large amount of energy is radiated in a direction 901 in which the first surface 1210a of the first printed circuit board 1210 is oriented and/or a direction 902 which is orthogonal to the direction 901 and is oriented toward the second plate 920.

Figure 13:
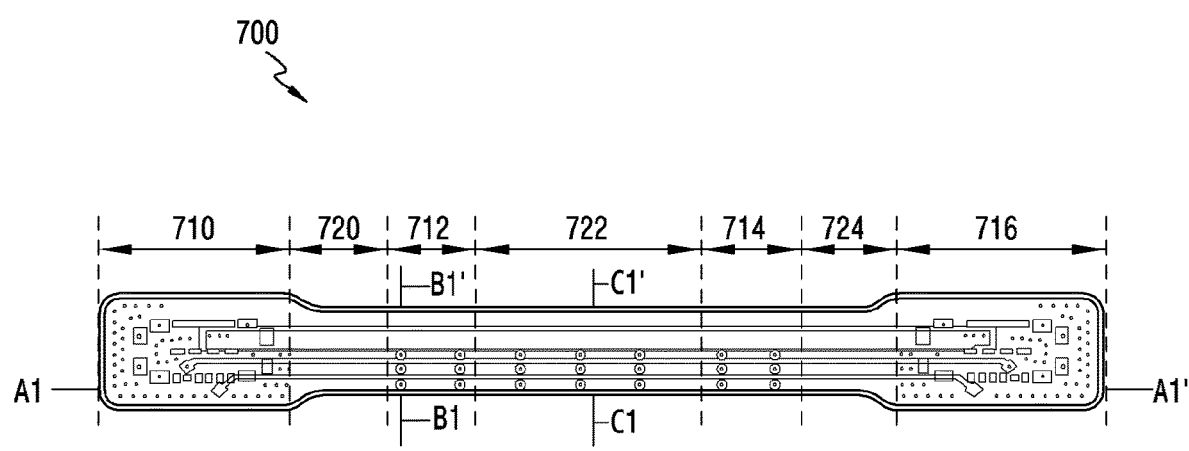
FIG. 13 is a plane view illustrating a rigid flexible printed circuit board according to an embodiment of the disclosure.

FIG. 13 is a plane view illustrating a rigid flexible printed circuit board according to an embodiment of the disclosure.

Referring to FIG. 13, the rigid flexible printed circuit board 700 according to an embodiment has the same structure as that of the rigid flexible printed circuit board 400 illustrated in FIG. 4, except for the number of formed rigid portions, the number of formed flexible portions, and a structure in which an air layer is formed, and thus, the description of the same structure will be omitted to avoid a redundant description.

For example, the rigid flexible printed circuit board 400 illustrated in FIG. 4 has a structure including the first to third rigid portions 420, 430, and 450 and the first and second flexible portions 410 and 440 between the first to third rigid portions, and the rigid flexible printed circuit board illustrated in FIG. 13 may include first to fourth rigid portions 710, 712, 714, and 716 and first to third flexible portions 720, 722, and 724. According to an embodiment, the first flexible portion 720 may be disposed between the first and second rigid portions 710 and 712, the second flexible portion 722 may be disposed between the second and third rigid portions 712 and 714, and the third flexible portion 724 may be disposed between the third and fourth rigid portions 714 and 716.

Figure 14:
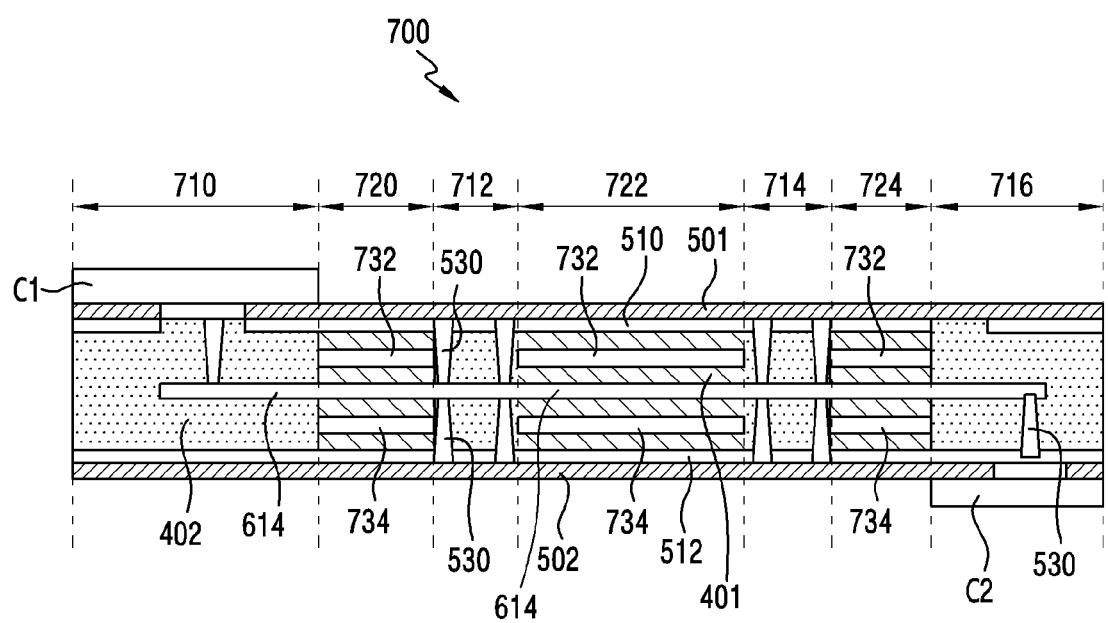
FIG. 14 is a cross-sectional view illustrating the rigid flexible printed circuit board of FIG. 13, cut along line A-A' according to an embodiment of the disclosure, and illustrates a state in which a connector is connected to opposite ends of the rigid flexible printed circuit board.

FIG. 14 is a cross-sectional view illustrating the rigid flexible printed circuit board of FIG. 13, cut along line A-A' according to an embodiment of the disclosure.

Figure 15:
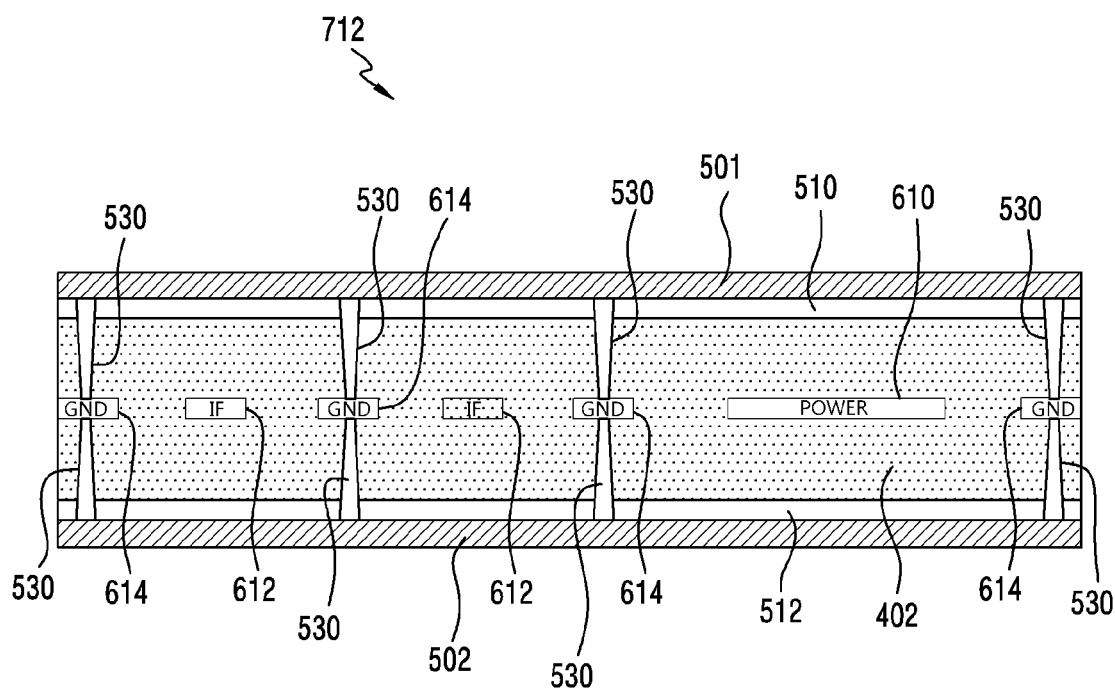
FIG. 15 is a cross-sectional view illustrating the rigid flexible printed circuit board of FIG. 13, cut along line B1-B1' according to an embodiment of the disclosure.

FIG. 15 is a cross-sectional view illustrating the rigid flexible printed circuit board of FIG. 13, cut along line B1-B1' according to an embodiment of the disclosure.

Figure 16:
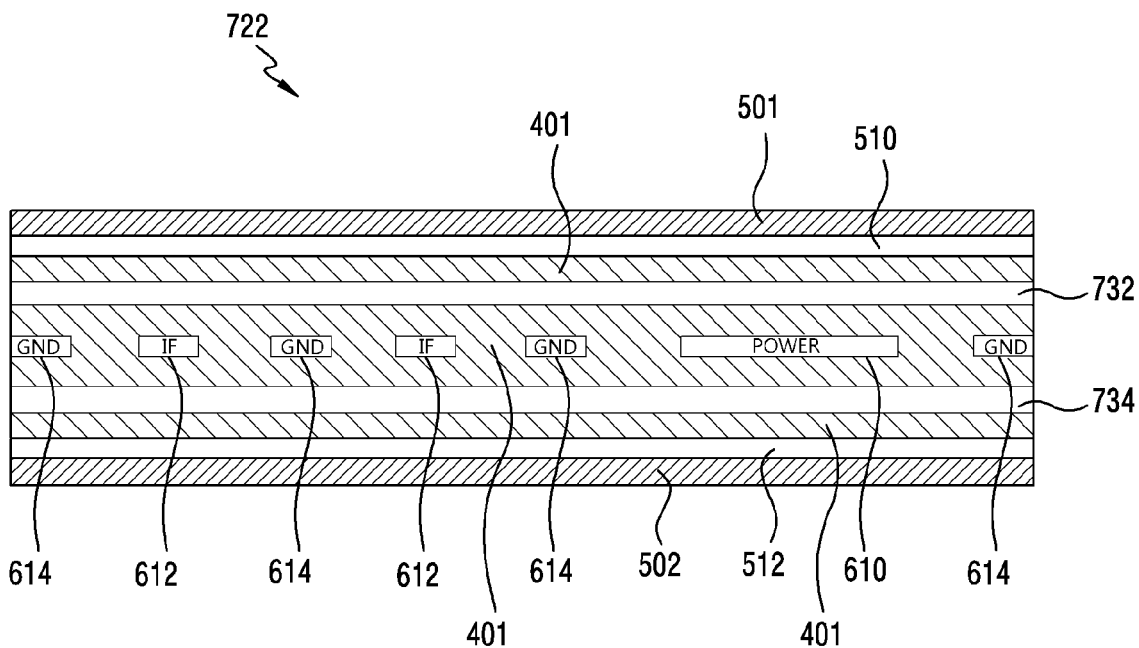
FIG. 16 is a cross-sectional view illustrating the rigid flexible printed circuit board of FIG. 13, cut along line C1-C1' according to an embodiment of the disclosure.

FIG. 16 is a cross-sectional view illustrating the rigid flexible printed circuit board of FIG. 13, cut along line C1-C1' according to an embodiment of the disclosure.

Referring to FIGS. 14 to 16, according an embodiment, at least one flexible portion of the first to third flexible portions 720, 722, and 724 may include at least one air layer 732 or 734. For example, the air layer 732 or 734 may be formed in the first flexible portion 720, the first and second flexible portions 720 and 722, or the first to third flexible portions 720, 722, and 724. According to an embodiment, in an interval the same flexible portion, the width of the air layer 732 or 734 may vary in consideration of the curved direction.

According to an embodiment, an air layer may include a first air layer 732 and a second air layer 734 spaced apart from the first air layer 732. According to an embodiment, the first air layer 732 may be formed between the first cover layer 501 and the conductive patterns 610 and 612. According to an embodiment, the first air layer 732 may be spaced apart from the first cover layer 501 and may be spaced apart from the conductive patterns 610 and 612. According to an embodiment, the first air layer 732 may be disposed between a first conductive layer, for example, the conductive patterns 610 and 612, and the second conductive layer 512. According to an embodiment, the second air layer 734 may be formed between the second cover layer 502 and the conductive patterns 610 and 612. According to an embodiment, the second air layer 734 may be spaced apart from the second cover layer 502 and may be spaced apart from the conductive patterns 610 and 612. According to an embodiment, the second air layer 734 may be disposed between the first conductive layer, for example, the conductive patterns 610 and 612, and the third conductive layer 614. According to an embodiment, the first air layer 732 may have one coming into contact with a rigid portion and the other end coming into contact with another rigid portion, and the second air layer 734 may have one end coming into contact with a rigid portion and the other end coming into contact with another rigid portion.

According to an embodiment, the first and second air layers 732 and 734 may be parallel to each other, and may be spaced apart from each other. According to an embodiment, multiple conductive patterns 610 and 612 and multiple conductive layers 613 may be positioned between the first and second air layers 732 and 734, wherein the first and second air layers 732 and 734 may be parallel to the conductive patterns 610 and 612 and the first to third conductive layers 614, 510, and 512, respectively.

According to an embodiment, the first and second air layers 732 and 734 may have dielectric constants that are different from those of the first to third flexible portions 720, 722, and 724.

Figure 17:
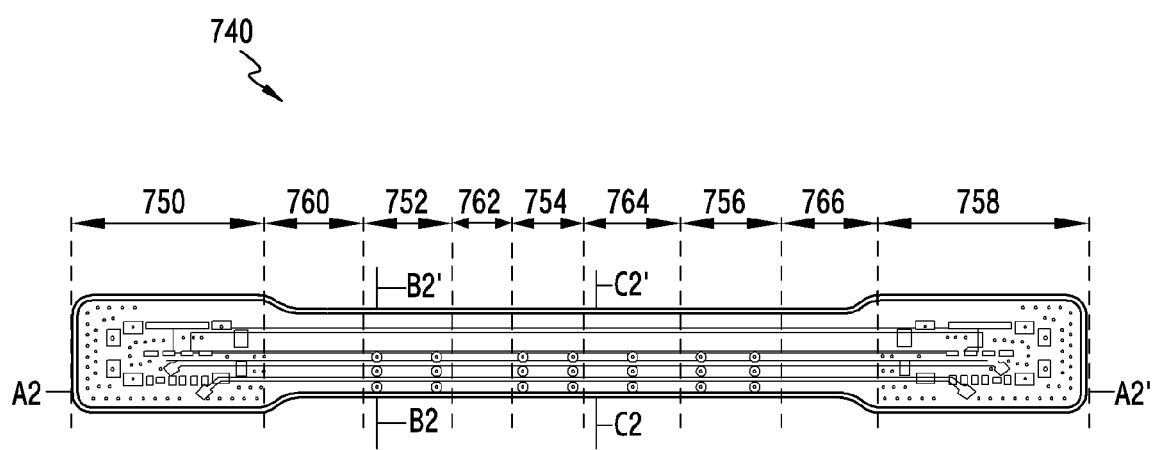
FIG. 17 is a plane view illustrating a rigid flexible printed circuit board according to an embodiment of the disclosure.

FIG. 17 is a plane view illustrating a rigid flexible printed circuit board according to an embodiment of the disclosure.

Figure 18:
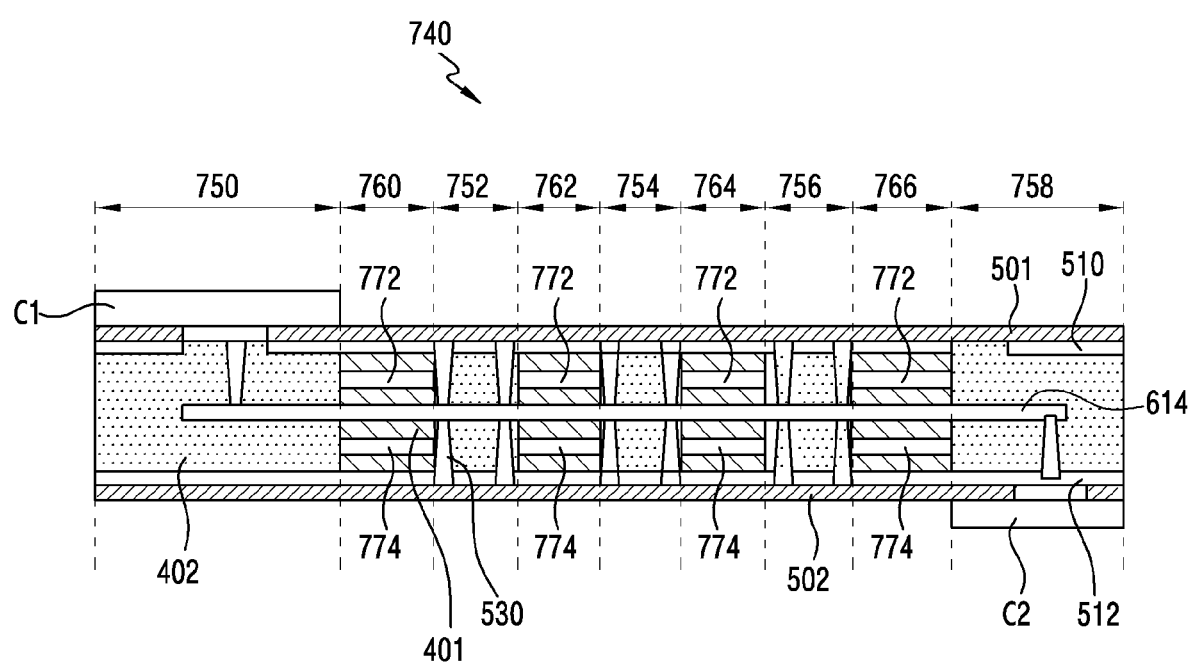
FIG. 18 is a cross-sectional view illustrating the rigid flexible printed circuit board of FIG. 17, cut along line A2-A2' according to an embodiment of the disclosure, and illustrates a state in which a connector is connected to opposite ends of the rigid flexible printed circuit board.

FIG. 18 is a cross-sectional view illustrating the rigid flexible printed circuit board of FIG. 17, cut along line A2-A2' according to an embodiment of the disclosure.

Figure 19:
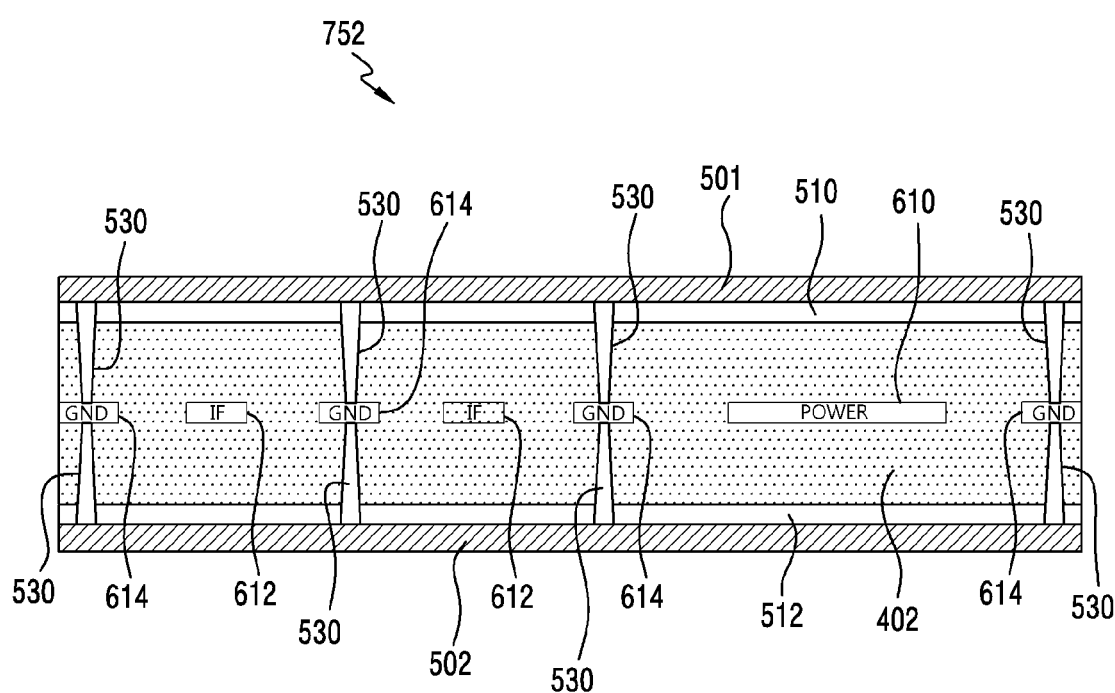
FIG. 19 is a cross-sectional view illustrating the rigid flexible printed circuit board of FIG. 17, cut along line B2-B2' according to an embodiment of the disclosure.

FIG. 19 is a cross-sectional view illustrating the rigid flexible printed circuit board of FIG. 17, cut along line B2-B2' according to an embodiment of the disclosure.

Figure 20:
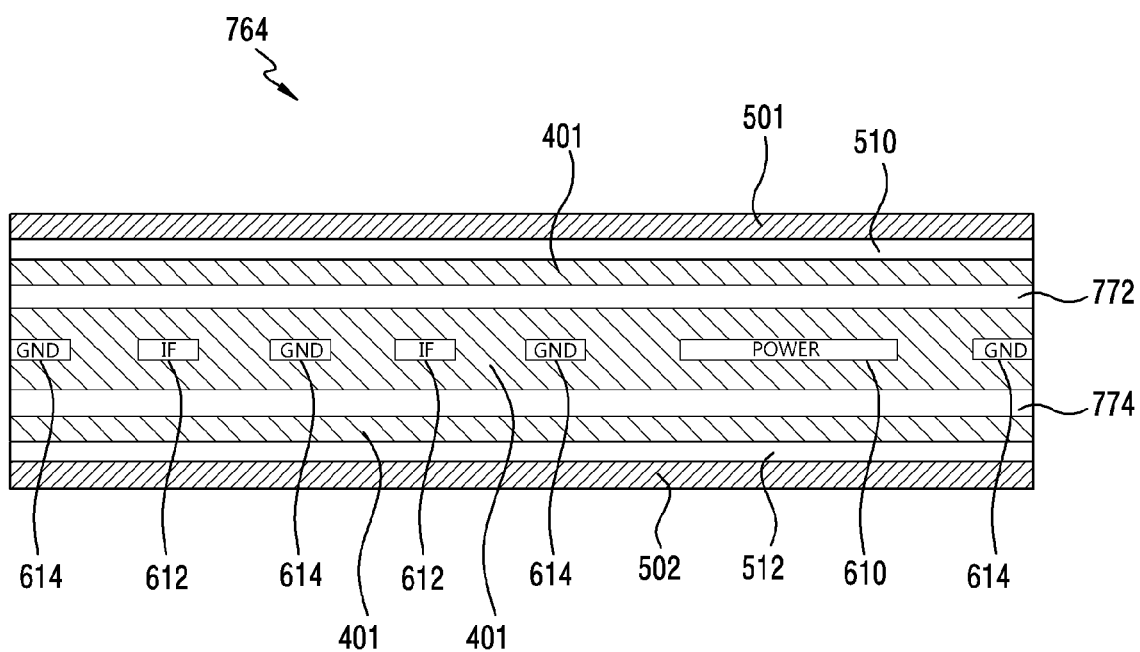
FIG. 20 is a cross-sectional view illustrating the rigid flexible printed circuit board of FIG. 17, cut along line C2-C2' according to an embodiment of the disclosure.

FIG. 20 is a cross-sectional view illustrating the rigid flexible printed circuit board of FIG. 17, cut along line C2-C2' according to an embodiment of the disclosure.

Referring to FIGS. 17 to 20, the rigid flexible printed circuit board 740 according to an embodiment has the same structure as that of the rigid flexible printed circuit board 700 illustrated in FIG. 13, expect for the number of formed rigid portions and the number of formed flexible portions, and thus, the description of the same structure will be omitted to avoid a redundant description.

For example, the rigid flexible printed circuit board 700 illustrated in FIG. 13 may have a structure including the first to fourth rigid portions 710, 712, 714, and 716 and the first to third flexible portions 720, 722, and 724 arranged between the first to fourth rigid portions. The rigid flexible printed circuit board 740 illustrated in FIGS. 17 to 20 may include the first to fifth rigid portions 750, 752, 754, 756, and 758 and the first to fourth flexible portions 760, 762, 764, and 766 arranged between the first to fifth portions.

According to an embodiment, the first flexible portion 760 may be disposed between the first and second rigid portions 750 and 752, the second flexible portion 762 may be disposed between the second and third rigid portions 752 and 754, the third flexible portion 764 may be disposed between the third and fourth rigid portions 754 and 756, and the fourth flexible portion 766 may be disposed between the fourth and fifth rigid portions 756 and 758.

According to an embodiment, the structures of first and second air layers 772 and 774 formed in the first to third flexible portions 760, 762, and 764 of the rigid flexible printed circuit board 740 are identical to the structures of the first and second air layers 732 and 734 illustrated in FIGS. 13 to 16, and thus, a detailed description thereof will be omitted.

Figure 21A:
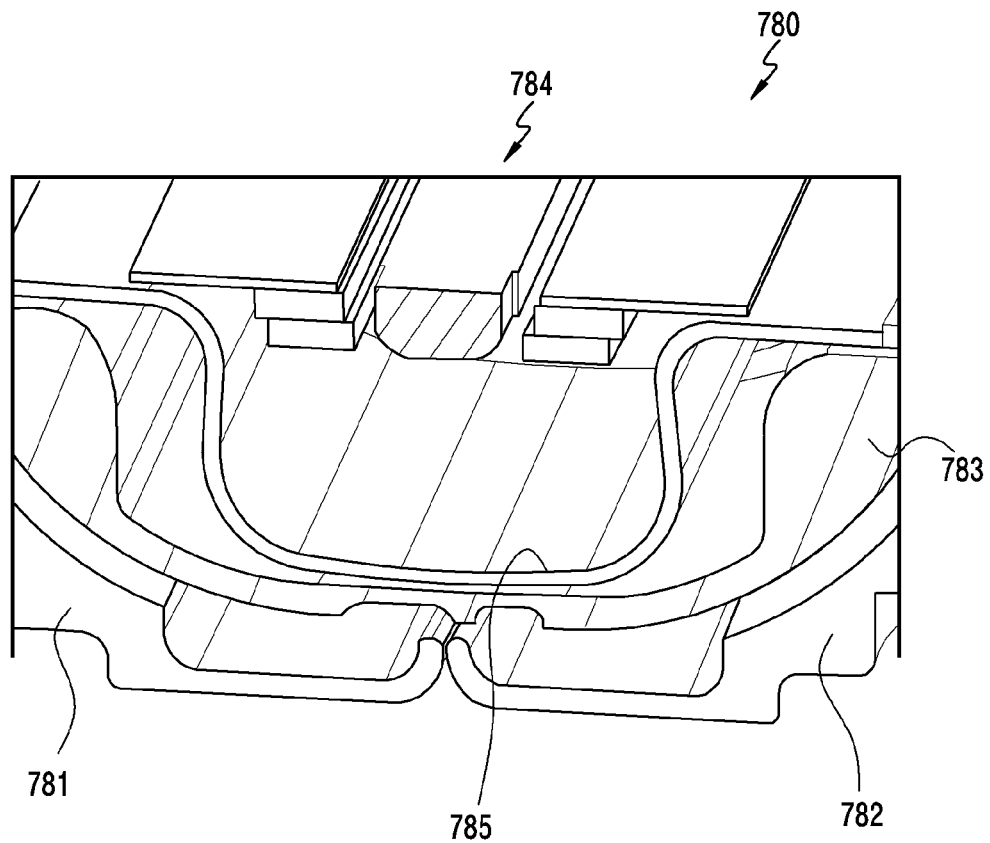
FIG. 21A is a perspective view illustrating a state in which a rigid flexible printed circuit board is disposed between a hinge assembly and a hinge housing of a foldable electronic device according to an embodiment of the disclosure.

FIG. 21A is a perspective view illustrating a state in which a rigid flexible printed circuit board is disposed between a hinge assembly and a hinge housing of a foldable electronic device according to an embodiment of the disclosure.

Figure 21B:
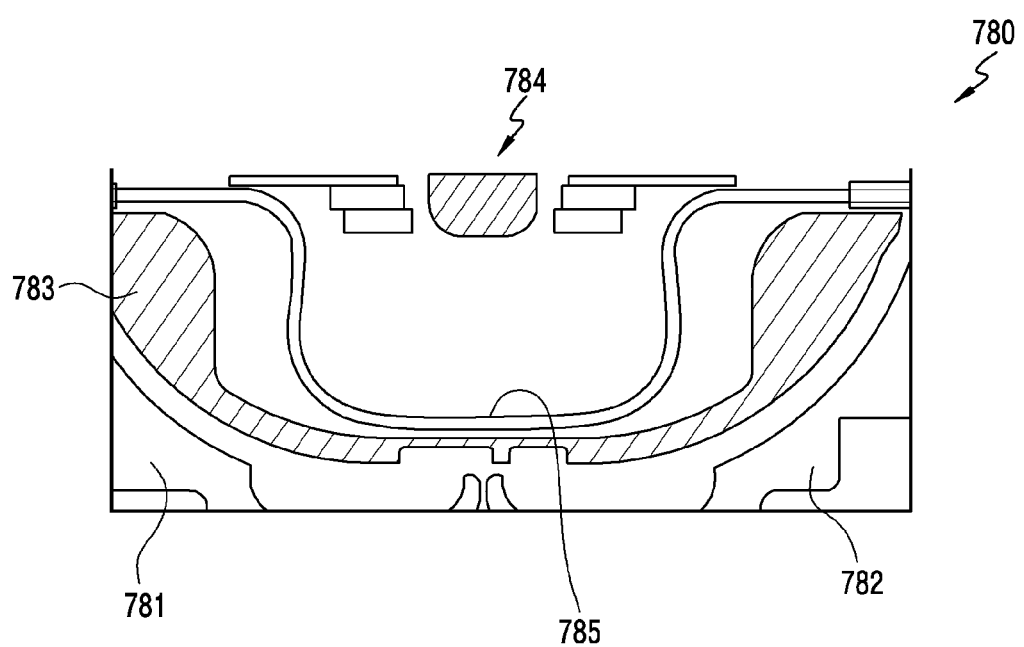
FIG. 21B is a cross-sectional view schematically illustrating a state in which a rigid flexible printed circuit board is disposed between a hinge assembly and a hinge housing of a foldable electronic device according to an embodiment of the disclosure.

FIG. 21B is a cross-sectional view schematically illustrating a state in which a rigid flexible printed circuit board is disposed between a hinge assembly and a hinge housing of a foldable electronic device according to an embodiment of the disclosure.

Referring to FIGS. 21A and 21B, a foldable electronic device 780 may include first and second housings 781 and 782, a hinge housing 783, a hinge assembly 784, and a rigid flexible printed circuit board 785. According to an embodiment, the rigid flexible printed circuit board 785 may include at least one of the rigid flexible printed circuit board 400 illustrated in FIG. 4, the rigid flexible printed circuit board 700 illustrated in FIG. 13, or the rigid flexible printed circuit board 740 illustrated in FIG. 17.

According to an embodiment, the hinge assembly 784 may connect the first and second housings 781 and 782 so that the first and second housings can be folded and unfolded, and the rigid flexible printed circuit board 785 may electrically connect a first element disposed on the first housing 781 and a second element disposed on the second housing 782. According to an embodiment, when performing a folding or unfolding operation of the foldable electronic device 780, the rigid flexible printed circuit board 785 enables stable signal transmission between the first and second elements, and may be received in the hinge housing 783 in a stable state.

Figure 22A:
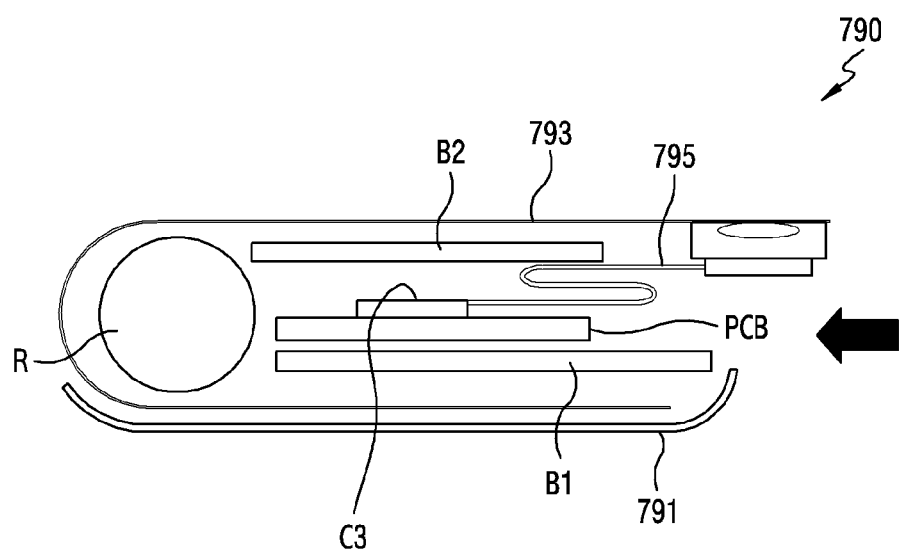
FIG. 22A is a side view illustrating a rigid flexible printed circuit board disposed on a rollable electronic device in a closed state according to an embodiment of the disclosure.

FIG. 22A is a side view illustrating a rigid flexible printed circuit board disposed on a rollable electronic device in a closed state according to an embodiment of the disclosure.

Figure 22B:
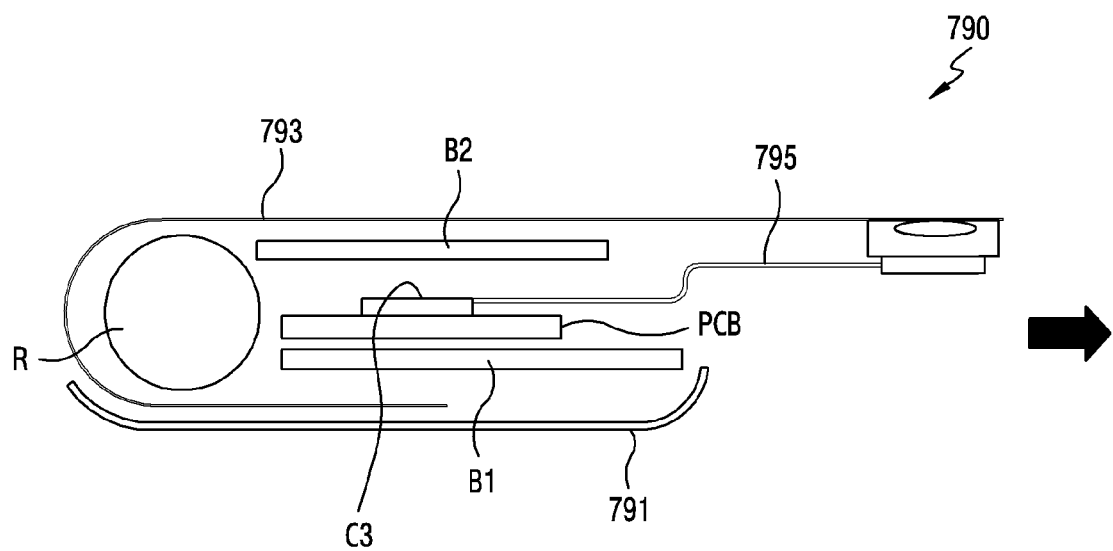
FIG. 22B is a side view illustrating a rigid flexible printed circuit board disposed on a rollable electronic device in an open state according to an embodiment of the disclosure.

FIG. 22B is a side view illustrating a rigid flexible printed circuit board disposed on a rollable electronic device in an open state according to an embodiment of the disclosure.

Referring to FIGS. 22A and 22B, a rollable electronic device 790 may include a body housing 791, a rollable display 793, a roller R, and a rigid flexible printed circuit board 795. According to an embodiment, the rigid flexible printed circuit board 795 may include at least one of the rigid flexible printed circuit board 400 illustrated in FIG. 4, the rigid flexible printed circuit board 700 illustrated in FIG. 13, or the rigid flexible printed circuit board 740 illustrated in FIG. 17.

According to an embodiment, while the rollable electronic device 790 is supported by a support frame (not shown) in a sliding-in or sliding-out state, the rollable display 793 may be withdrawn from the body housing 791 and a display area thereof may be extended. Such a driving strength may be derived from driving of a driving motor (not shown) and a roller R. According to an embodiment, in the sliding-in or sliding-out state of the rollable electronic device 790, the rigid flexible printed circuit board 795 enables a stable signal transfer between the rollable display 793 and a main circuit board (PCB). B1 may indicate a part of an internal support bracket for supporting the printed circuit board, and B2 may indicate a part of an internal support bracket for supporting the rollable display.

According to an embodiment, an electronic device (e.g., the electronic device 101 of FIG. 1) may include a first electrical element, a second electrical element, and a rigid flexible printed circuit board (e.g., the rigid flexible printed circuit board 400 of FIG. 4) configured to electrically connect the first electrical element to the second electrical element, wherein the rigid flexible printed circuit board (e.g., the rigid flexible printed circuit board 400 of FIG. 4) includes at least one flexible portion (e.g., the flexible portion 410 or 440 of FIG. 5) including a first dielectric (e.g., the first dielectric 401 of FIG. 5) which has a first dielectric constant and is flexible, at least one rigid portion (e.g., the rigid portion 420, 430, or 450 of FIG. 5) which extends from the flexible portion (e.g., the flexible portion 410 or 440 of FIG. 5), and includes a second dielectric (e.g., the second dielectric 402 of FIG. 5) which has a second dielectric constant and is less flexible than the first dielectric (e.g., the first dielectric 401 of FIG. 5), multiple conductive patterns (e.g., the conductive patterns 610 and 612 of FIG. 6) formed inside the first dielectric (e.g., the first dielectric 401 of FIG. 5) and the second dielectric (e.g., the second dielectric 402 of FIG. 5), multiple conductive layers (e.g., the multiple conductive layers 510, 512, and 614 of FIG. 5) formed on the first dielectric (e.g., the first dielectric 401 of FIG. 5) and the second dielectric (e.g., the second dielectric 402 of FIG. 5), and multiple conductive vias which are formed in the rigid portion (e.g., the rigid portion 420, 430, or 450 of FIG. 5) and electrically connect the multiple conductive layers (e.g., the conductive layers 510, 512, and 614 of FIG. 5) to each other or the multiple conductive patterns (e.g., the conductive patterns 610 and 612 of FIG. 6) to each other.

According to an embodiment, the first dielectric (e.g., the first dielectric 401 of FIG. 5) may be formed of a liquid crystal polymer (LCP).

According to an embodiment, the second dielectric (e.g., the second dielectric 402 of FIG. 5) may be formed of a prepreg.

According to an embodiment, the first dielectric (e.g., the first dielectric 401 of FIG. 5) may be formed of an insulation thermoplastic resin, and the second dielectric (e.g., the second dielectric 402 of FIG. 5) may be formed of an insulation thermosetting resin.

According to an embodiment, the first dielectric constant may be substantially identical to the second dielectric constant.

According to an embodiment, a first glass transition temperature' that a first insulation bonding material for forming the first dielectric (e.g., the first dielectric 401 of FIG. 5) may be lower than a second glass transition temperature that a second insulation bonding material for forming the second dielectric (e.g., the second dielectric 402 of FIG. 5) has.

According to an embodiment, the flexible portion (e.g., the flexible portion 410 or 440 of FIG. 5) and the rigid portion (e.g., the rigid portion 420, 430, or 450 of FIG. 5) may form impedance having substantially the same magnitude corresponding to a designated frequency.

According to an embodiment, the first electrical element, as an antenna module, may include a first printed circuit board (e.g., the first printed circuit board 310 of FIG. 3) including at least one antenna array, and a first wireless communication circuit disposed on the first printed circuit board (e.g., the first printed circuit board 310 of FIG. 3) and electrically connected to the at least one antenna array, and the second electrical element may include a second printed circuit board (e.g., the second printed circuit board 370 of FIG. 3), and a second wireless communication circuit disposed on the second printed circuit board (e.g., the second printed circuit board 370 of FIG. 3), wherein one end of the rigid flexible printed circuit board (e.g., the rigid flexible printed circuit board 400 of FIG. 4) is electrically connected to the first printed circuit board (e.g., the first printed circuit board 310 of FIG. 3), and the other end of the rigid flexible printed circuit board (e.g., the rigid flexible printed circuit board 400 of FIG. 4) is electrically connected to the second printed circuit board (e.g., the second printed circuit board 370 of FIG. 3).

According to an embodiment, the antenna array may include a first antenna element and a second antenna element disposed to be spaced apart from the first antenna element, and the first wireless communication circuit may include a first electrical path electrically connected to a first point on the first antenna element, and a second electrical path electrically connected to a second point on the second antenna element, wherein a phase difference between a first signal at the first point and a second signal at the second point is provided.

According to an embodiment, the flexible portion (e.g., the flexible portion 722 of FIG. 16) may further include at least one air layer (e.g., the air layer 732 or 734 of FIG. 16).

According to an embodiment, the rigid flexible printed circuit board (e.g., the rigid flexible printed circuit board 700 of FIG. 13) may further include: a first cover layer (e.g., the first cover layer 501 of FIG. 15) covering one side; and a second cover layer (e.g., the second cover layer 502 of FIG. 15) covering the other side that is opposite to the one side, and the air layer may further include a first air layer (e.g., the first air layer 732 of FIG. 16) formed between the first cover layer and the conductive patterns (e.g., the conductive patterns 610 and 612 of FIG. 15), wherein the first air layer (e.g., the first air layer 732 of FIG. 16) is disposed to be spaced apart from each of the first cover layer and the conductive patterns.

According to an embodiment, the air layer further may further include a second air layer (e.g., the second air layer 734 of FIG. 16) formed between the second cover layer and the conductive patterns, wherein the second air layer (e.g., the second air layer 734 of FIG. 16) is disposed to be spaced apart from each of the second cover layer and the conductive patterns.

According to an embodiment, a rigid flexible printed circuit board (e.g., the rigid flexible printed circuit board 400 of FIG. 4) may correspond to a printed circuit board including at least one flexible portion (e.g., the flexible portion 410 or 440 of FIG. 5) including at least one air layer (e.g., the first air layer 732 of FIG. 16), and at least one rigid portion (e.g., the rigid portion 420, 430, or 450 of FIG. 5) extending from the flexible portion (e.g., the flexible portion 410 or 440 of FIG. 5), and may include a first cover layer oriented in a first direction, a second cover layer oriented in a second direction that faces the first direction, a first conductive layer positioned between the first cover layer and the second cover layer, a second conductive layer positioned between the second cover layer and the first conductive layer, and a third conductive layer positioned between the second conductive layer and the first conductive layer, wherein one or more conductive vias are formed in the at least one rigid portion (e.g., the rigid portion 420, 430, or 450 of FIG. 5), and the one or more vias electrically connect the first to third conductive layers (e.g., the conductive layers 510, 512, and 614 of FIG. 5) to each other.

According to an embodiment, the air layer may further include a first air layer (e.g., the first air layer 732 of FIG. 16) disposed between the first and second conductive layers (e.g., the first and third conductive layers 510 and 614 of FIG. 15), and a second air layer (e.g., the second air layer 734 of FIG. 16) disposed between the second and third conductive layers (e.g., the second and third conductive layers 512 and 614 of FIG. 15).

According to an embodiment, the first air layer (e.g., the first air layer 732 of FIG. 16) may be disposed to be spaced apart from each of the first cover layer (e.g., the first cover layer 501 of FIG. 15) and the conductive patterns (e.g., the conductive patterns 610 and 612 of FIG. 15), and the second air layer (e.g., the second air layer 732 of FIG. 16) may be disposed to be spaced apart from each of the second cover layer (e.g., the second cover layer 502 of FIG. 15) and the conductive patterns (e.g., the conductive patterns 610 and 612 of FIG. 15).

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
a first electrical element and a second electrical element; and
a rigid flexible printed circuit board configured to electrically connect the first electrical element to the second electrical element,
wherein the rigid flexible printed circuit board comprises:
a first flexible portion comprising a first dielectric that has a first dielectric constant and is flexible,
a second flexible portion comprising the first dielectric,
a rigid portion comprising a second dielectric that has a second dielectric constant and is less flexible than the first dielectric, the first flexible portion extending from a first end of the rigid portion, and the second flexible portion extending from a second end of the rigid portion that is opposite the first end of the rigid portion,
multiple conductive patterns formed inside the first dielectric and the second dielectric,
multiple conductive layers formed on the first dielectric and the second dielectric, and
multiple conductive vias which are formed in the rigid portion and electrically connect the multiple conductive layers to each other or the multiple conductive patterns to each other.

2. The electronic device of claim 1, wherein the first dielectric is formed of a liquid crystal polymer (LCP).

3. The electronic device of claim 2, wherein the second dielectric is formed of prepreg.

4. The electronic device of claim 1,
wherein the first dielectric is formed of an insulation thermoplastic resin, and
wherein the second dielectric is formed of an insulation thermosetting resin.

5. The electronic device of claim 1, wherein the first dielectric constant is substantially identical to the second dielectric constant.

6. The electronic device of claim 1, wherein a first glass transition temperature of a first insulation bonding material used for forming the first dielectric is lower than a second glass transition temperature of a second insulation bonding material used for forming the second dielectric.

7. The electronic device of claim 1, wherein the first flexible portion, the second flexible portion, and the rigid portion have a substantially same impedance corresponding to a designated frequency.

8. The electronic device of claim 1,
wherein the first electrical element comprises:
a first printed circuit board comprising at least one antenna array, and
a first wireless communication circuit disposed on the first printed circuit board and electrically connected to the at least one antenna array,
wherein the second electrical element comprises:
a second printed circuit board, and
a second wireless communication circuit disposed on the second printed circuit board, and
wherein one end of the rigid flexible printed circuit board is electrically connected to the first printed circuit board, and another end of the rigid flexible printed circuit board is electrically connected to the second printed circuit board.

9. The electronic device of claim 8,
wherein the at least one antenna array comprises:
a first antenna element, and
a second antenna element disposed to be spaced apart from the first antenna element,
wherein the first wireless communication circuit comprises:
a first electrical path electrically connected to a first point on the first antenna element, and
a second electrical path electrically connected to a second point on the second antenna element, and
wherein a phase difference between a first signal at the first point and a second signal at the second point is provided.

10. The electronic device of claim 1, wherein the rigid flexible printed circuit board further comprises:
a first cover layer forming an upper surface of the rigid flexible printed circuit board, which covers a first side of the first flexible portion, the second flexible portion, and the rigid portion, and
a second cover layer forming a lower surface of the rigid flexible printed circuit board, which covers a second side of the first flexible portion, the second flexible portion, and the rigid portion that is opposite the first side of the first flexible portion, the second flexible portion, and the rigid portion.

11. The electronic device of claim 10,
wherein the first flexible portion further comprises at least one air layer,
wherein the second flexible portion further comprises the at least one air layer,
wherein the at least one air layer further comprises a first air layer formed between the first cover layer and the multiple conductive patterns, and
wherein the first air layer is disposed to be spaced apart from each of the first cover layer and the multiple conductive patterns.

12. The electronic device of claim 11,
wherein the at least one air layer further comprises a second air layer formed between the second cover layer and the multiple conductive patterns, and
wherein the second air layer is disposed to be spaced apart from each of the second cover layer and the multiple conductive patterns.

13. A rigid flexible printed circuit board comprising:
a first flexible portion comprising at least one air layer;
a second flexible portion comprising the at least one air layer;
a rigid portion, the first flexible portion extending from a first end of the rigid portion, and the second flexible portion extending from a second end of the rigid portion that is opposite the first end of the rigid portion;
a first cover layer forming an upper surface of the rigid flexible printed circuit board, which covers a first side of the first flexible portion, the second flexible portion, and the rigid portion;
a second cover layer forming a lower surface of the rigid flexible printed circuit board, which covers a second side of the first flexible portion, the second flexible portion, and the rigid portion that is opposite the first side of the first flexible portion, the second flexible portion, and the rigid portion;
a first conductive layer positioned between the first cover layer and the second cover layer;
a second conductive layer positioned between the first conductive layer and the second cover layer;
a third conductive layer positioned between the first conductive layer and the second conductive layer;

one or more conductive vias formed in the rigid portion that electrically connect the first to third conductive layers to each other; and
at least one conductive pattern positioned between the first conductive layer and the second conductive layer.

14. The rigid flexible printed circuit board of claim 13, wherein the at least one air layer comprises:
a first air layer disposed between:
the first conductive layer, and
both the third conductive layer and the at least one conductive pattern; and
a second air layer disposed between:
both the third conductive layer and the at least one conductive pattern, and
the second conductive layer.

15. The rigid flexible printed circuit board of claim 14, wherein the first air layer is disposed to be spaced apart from:
the first conductive layer, and
both the third conductive layer and the at least one conductive pattern, and
wherein the second air layer is disposed to be spaced apart from:
both the third conductive layer and the at least one conductive pattern, and
the second conductive layer.

16. The rigid flexible printed circuit board of claim 15, wherein the first air layer in the first flexible portion abuts the first end of the rigid portion, and
wherein the first air layer in the second flexible portion abuts the second end of the rigid portion.

17. The rigid flexible printed circuit board of claim 16, wherein the second air layer in the first flexible portion abuts the first end of the rigid portion, and
wherein the second air layer in the second flexible portion abuts the second end of the rigid portion.

18. The rigid flexible printed circuit board of claim 14, wherein the first air layer and the second air layer are parallel to each other and spaced apart from each other.

19. The rigid flexible printed circuit board of claim 13, further comprising:
another rigid portion;
a third flexible portion comprising the at least one air layer; and
one or more other conductive vias formed in the another rigid portion that electrically connect the first to third conductive layers to each other,
wherein a first end of the second flexible portion extends from a first end of the another rigid portion, the first end of the second flexible portion being opposite a second end of the second flexible portion that extends from the second end of the rigid portion,
wherein the third flexible portion extends from a second end of the another rigid portion that is opposite the first end of the another rigid portion,
wherein the first cover layer covers a first side of the another rigid portion and the third flexible portion, and
wherein the second cover layer covers a second side of the another rigid portion and the third flexible portion that is opposite the first side of the another rigid portion and the third flexible portion.

20. The electronic device of claim 1, wherein the rigid flexible printed circuit board further comprises:
a first cover layer forming an upper surface of the rigid flexible printed circuit board, which covers a first side of the first flexible portion, the second flexible portion, and the rigid portion,
a second cover layer forming a lower surface of the rigid flexible printed circuit board, which covers a second side of the first flexible portion, the second flexible portion, and the rigid portion that is opposite the first side of the first flexible portion, the second flexible portion, and the rigid portion,
another rigid portion comprising the second dielectric;
a third flexible portion comprising the first dielectric; and
multiple other conductive vias which are formed in the another rigid portion and electrically connect the multiple conductive layers to each other or the multiple conductive patterns to each other,
wherein a first end of the second flexible portion extends from a first end of the another rigid portion, the first end of the second flexible portion being opposite a second end of the second flexible portion that extends from the second end of the rigid portion,
wherein the third flexible portion extends from a second end of the another rigid portion that is opposite the first end of the another rigid portion,
wherein the first cover layer covers a first side of the another rigid portion and the third flexible portion, and
wherein the second cover layer covers a second side of the another rigid portion and the third flexible portion that is opposite the first side of the another rigid portion and the third flexible portion.

\* \* \* \* \*